(12) United States Patent
Tan et al.

(10) Patent No.: US 12,727,111 B2
(45) Date of Patent: Sep. 1, 2026

(54) SUSPENSION RACK AND ELECTRONIC DEVICE

(71) Applicant: Wistron Corporation, New Taipei City (TW)

(72) Inventors: Siyun Tan, New Taipei City (TW); Yisheng Chen, New Taipei City (TW)

(73) Assignee: Wistron Corporation, New Taipei City (TW)

( * ) Notice: Subject to any disclaimer, the term of this patent is extended or adjusted under 35 U.S.C. 154(b) by 123 days.

(21) Appl. No.: 18/810,434

(22) Filed: Aug. 20, 2024

(65) Prior Publication Data

US 2026/0025942 A1 Jan. 22, 2026

(30) Foreign Application Priority Data

Jul. 22, 2024 (CN) ......................... 202410986115.6

(51) Int. Cl.
*H05K 7/14* (2006.01)
*H05K 7/16* (2006.01)
*H05K 7/18* (2006.01)

(52) U.S. Cl.
CPC ........... *H05K 7/183* (2013.01); *H05K 7/1411* (2013.01); *H05K 7/1488* (2013.01); *H05K 7/16* (2013.01)

(58) Field of Classification Search
CPC .. H05K 7/1411; H05K 7/1485; H05K 7/1488; H05K 7/1489
USPC ........... 248/122.1, 298.1, 429; 361/726–727; 16/303
See application file for complete search history.

(56) References Cited

U.S. PATENT DOCUMENTS 4,660,791 A * 4/1987 Lisak ..................... F16M 11/10 248/141
5,187,744 A * 2/1993 Richter ................ F16M 11/041 379/426
5,305,381 A * 4/1994 Wang .................. B60R 11/0241 379/426
5,308,158 A * 5/1994 Vogelgesang ........ A47B 46/005 312/319.3
5,457,745 A * 10/1995 Wang .................. B60R 11/0241 379/426
5,555,302 A * 9/1996 Wang .................. B60R 11/0241 379/426
5,788,202 A * 8/1998 Richter ............... B60R 11/0241 224/570

(Continued)

FOREIGN PATENT DOCUMENTS

CN 2741071 11/2005
CN 208901036 5/2019

(Continued)

*Primary Examiner* — Adrian S Wilson
(74) *Attorney, Agent, or Firm* — JCIPRNET

(57) ABSTRACT

A suspension rack includes a supporting member, a bracket, and a linkage mechanism. The bracket is slidably disposed on the supporting member. The linkage mechanism includes a rotating member and a linking bar. The rotating member is rotatably disposed on the supporting member. One end of the linking bar is pivotally connected to the rotating member, and the other end of the linking bar is pivotally connected to the bracket. The bracket is driven to slide relative to the supporting member through the linking bar by the rotating member. An electronic device is also provided.

20 Claims, 31 Drawing Sheets

(56) References Cited

U.S. PATENT DOCUMENTS

| | | | | |
|---|---|---|---|---|
| 5,903,645 | A * | 5/1999 | Tsay | B60R 11/0241 248/316.4 |
| 6,256,387 | B1 * | 7/2001 | Wang | H04M 1/04 379/446 |
| 7,523,919 | B2 * | 4/2009 | Hanlon | B66D 1/12 248/329 |
| 8,379,840 | B2 * | 2/2013 | Scherling | G06F 1/1624 455/575.4 |
| 2002/0171251 | A1 * | 11/2002 | Bieck | E05B 77/06 292/336.3 |
| 2004/0123781 | A1 * | 7/2004 | D'Agostino | A47B 51/00 108/42 |
| 2007/0279856 | A1 * | 12/2007 | Bragg | G06F 1/1632 361/732 |
| 2015/0145393 | A1 * | 5/2015 | Young | A47B 46/005 312/246 |
| 2020/0073130 | A1 * | 3/2020 | Wang | H05K 7/16 |

FOREIGN PATENT DOCUMENTS

| | | | | |
|---|---|---|---|---|
| CN | 110928116 | | 3/2020 | |
| CN | 111554132 | | 8/2020 | |
| CN | 115157300 | * | 10/2022 | B25J 15/00 |

* cited by examiner 100
120
122
126
121
1221
1241(124)
S
D1
A2
123
110
1272
1252
A1
1251
1211
D2
A
125

120
122
1221
1252
1241
1251
1211
121
127
1242
128
123
129
124
125

SUSPENSION RACK AND ELECTRONIC DEVICE

CROSS-REFERENCE TO RELATED APPLICATION

This application claims the priority benefit of China application serial no. 202410986115.6 filed on Jul. 22, 2024. The entirety of the above-mentioned patent application is hereby incorporated by reference herein and made a part of this specification.

BACKGROUND

Technical Field

The disclosure relates to a storage rack and an electronic device, and in particular, to a suspension rack and an electronic device having the suspension rack.

Description of Related Art

In the server equipment available on the market, the server is installed on a desktop or the entire rack is arranged on the floor. However, such an arrangement takes up much space. Therefore, how to save the space occupied by the server equipment while allowing users to operate or repair the equipment conveniently is an important issue in this field.

SUMMARY

The disclosure provides a suspension rack and an electronic device through which an occupied space is reduced and a user is allowed to operate conveniently.

The disclosure provides a suspension rack including a supporting member, a bracket, and a linkage mechanism. The bracket is slidably disposed on the supporting member. The linkage mechanism includes a rotating member and a linking bar. The rotating member is rotatably disposed on the supporting member. One end of the linking bar is pivotally connected to the rotating member, and the other end of the linking bar is pivotally connected to the bracket. The bracket is driven to slide relative to the supporting member through the linking bar by the rotating member.

The disclosure further provides an electronic device including an object and a suspension rack. The suspension rack includes a supporting member, a bracket, and a linkage mechanism. The bracket is slidably disposed on the supporting member and is provided with a carrying portion. An accommodating space is formed between the carrying portion and the supporting member. The object is used to be carried by the carrying portion in the accommodating space. The linkage mechanism includes a rotating member and a linking bar. The rotating member is rotatably disposed on the supporting member. One end of the linking bar is pivotally connected to the rotating member, and the other end of the linking bar is pivotally connected to the bracket. The bracket is driven to slide relative to the supporting member through the linking bar by the rotating member.

The disclosure further provides a suspension rack including a supporting member, a bracket, a tray, an adjusting mechanism, and a linkage mechanism. The bracket is slidably disposed on the supporting member and is provided with a carrying portion. The tray is used to be carried by the carrying portion of the bracket. The adjusting mechanism is connected between the supporting member and the tray and drives the tray to be lifted and lowered. The linkage mechanism includes a rotating member and a linking bar. The rotating member is rotatably disposed on the supporting member. One end of the linking bar is pivotally connected to the rotating member, and the other end of the linking bar is pivotally connected to the bracket. The bracket is driven to slide relative to the supporting member through the linking bar by the rotating member.

In an embodiment of the disclosure, the suspension rack further includes an elastic member. The elastic member is connected between the bracket and the supporting member. The bracket is used to resist an elastic force of the elastic member, and the bracket is driven to slide relative to the supporting member by the elastic force of the elastic member.

In an embodiment of the disclosure, the suspension rack further includes a push-push mechanism. The push-push mechanism is connected to the rotating member, and the rotating member is driven to rotate by the push-push mechanism.

In an embodiment of the disclosure, the push-push mechanism includes a movable member, an elastic member, and a column. The movable member is provided with a guiding groove. The elastic member is connected between the movable member and the supporting member. The column is connected to the rotating member and extends into the guiding groove. The movable member is used to be subjected to a force to resist an elastic force of the elastic member, and the movable member is moved upwardly through the elastic force of the elastic member. The column is moved along the guiding groove as the movable member is driven to rotate by the rotating member.

In an embodiment of the disclosure, the guiding groove includes at least one inclined section. The column is moved along the inclined section as the movable member is driven to rotate by the rotating member.

In an embodiment of the disclosure, the guiding groove is provided with a step difference portion, and a moving direction of the column in the guiding groove is limited by the step difference portion.

In an embodiment of the disclosure, the bracket includes two brackets, and the linking bar includes two linking bars. The two brackets are disposed at two opposite ends of the supporting member by the two linking bars. The two brackets are driven to move away from or be close to each other relative to the supporting member through the two linking bars.

In an embodiment of the disclosure, the suspension rack further includes a tray and an adjusting mechanism. The tray is connected to the supporting member through the adjusting mechanism, and the tray is driven to be close to or move away from the supporting member by the adjusting mechanism.

In an embodiment of the disclosure, the adjusting mechanism includes at least one connecting bar assembly and an elastic component. The connecting bar assembly is connected between the supporting member and the tray, and the tray is driven to lift and lower relative to the supporting member by the connecting bar assembly. The elastic component is connected between the tray and the supporting member and is used to provide an elastic force to assist the tray to be lifted.

In an embodiment of the disclosure, the elastic component includes a coil spring and a rotating shaft rotatably disposed on the tray. The coil spring is connected between the rotating shaft and the supporting member and is at least partially wound around the rotating shaft.

In an embodiment of the disclosure, the suspension rack further includes a rack member. The rack member is slidably disposed on the tray and abuts against the connecting bar assembly. The rotating shaft is provided with a gear portion meshed with the rack member, and the rack member is driven to slide along the tray as the rotating shaft rotates.

In an embodiment of the disclosure, the suspension rack further includes a handle component including a handle body and a stopping member. The handle body is rotatably connected to the tray. The stopping member is slidably disposed on the handle body, and the handle body is detachably engaged with the rotating shaft through the stopping member.

In an embodiment of the disclosure, the handle component includes a linkage member connected to the handle body and rotatably connected to the stopping member.

In an embodiment of the disclosure, the rotating shaft is provided with a ratchet structure. The stopping member is provided with a meshing portion used to be meshed with the ratchet structure.

In an embodiment of the disclosure, when the two brackets are close to each other to a carrying position, the carrying portion is used to carry the object. Further, when the two brackets move away from each other to a release position, the object is used to leave or enter the accommodating space.

In an embodiment of the disclosure, when the handle component is in a folded state, an operating portion of the handle body is adjacent to the tray. When the handle component is in an unfolded state, the operating portion of the handle body is away from the tray.

To sum up, in the electronic device and the suspension rack provided by the disclosure, when the rotating member of the linkage mechanism rotates relative to the supporting member, the linking bar pivotally connected to the rotating member is synchronously driven and further drives the bracket pivotally connected to the other end of the linking bar, so that the bracket slides relative to the supporting member. The user may carry a server in the accommodating space or take the server out of the accommodating space according to the position of the bracket relative to the supporting member. In an embodiment, the suspension rack may further include the adjusting mechanism to drive the server to be lifted and lowered. In such an operating mechanism, the space occupied by the suspension rack is reduced, and the user is able to operate the suspension rack conveniently.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
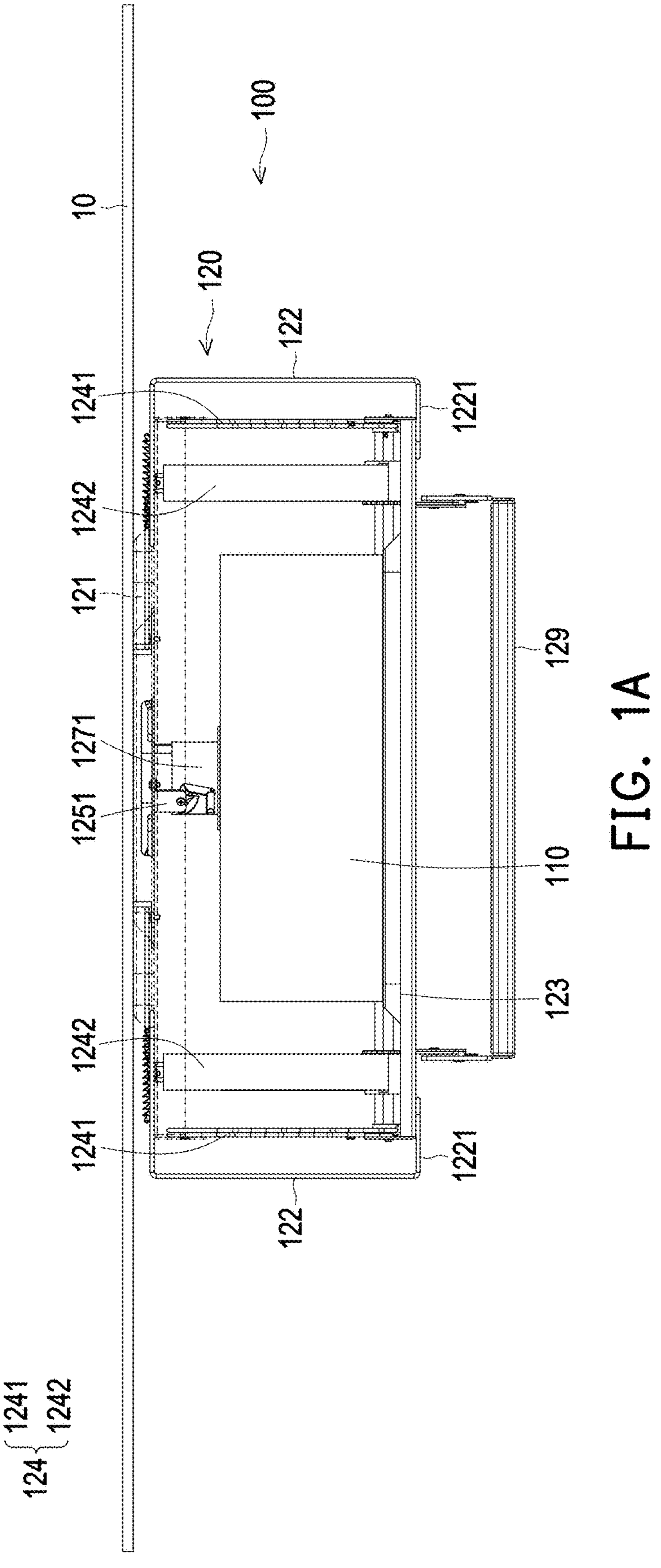
FIG. 1A to FIG. 1E are side views of an operation process of an electronic device according to an embodiment of the disclosure.

FIG. 1A to FIG. 1E are side views of an operation process of an electronic device according to an embodiment of the disclosure. In order to clearly illustrate a structure of a suspension rack 120, a supporting member 121 in FIG. 1A to FIG. 1E is shown in a perspective manner. With reference to FIG. 1A, an electronic device 100 provided by this embodiment is used to be installed on a ceiling 10, and the electronic device 100 includes an object 110 (such as a server) and the suspension rack 120.

Figure 1D:
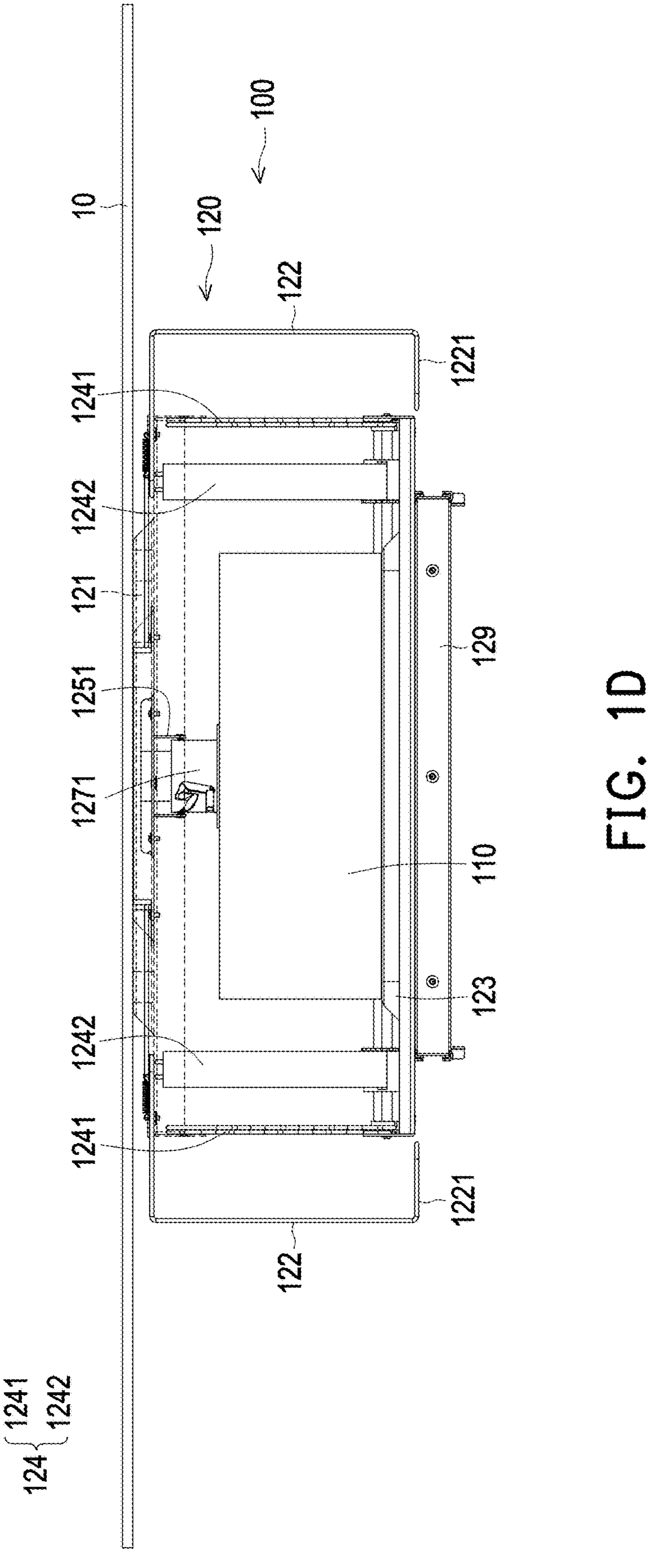
Figure 2:
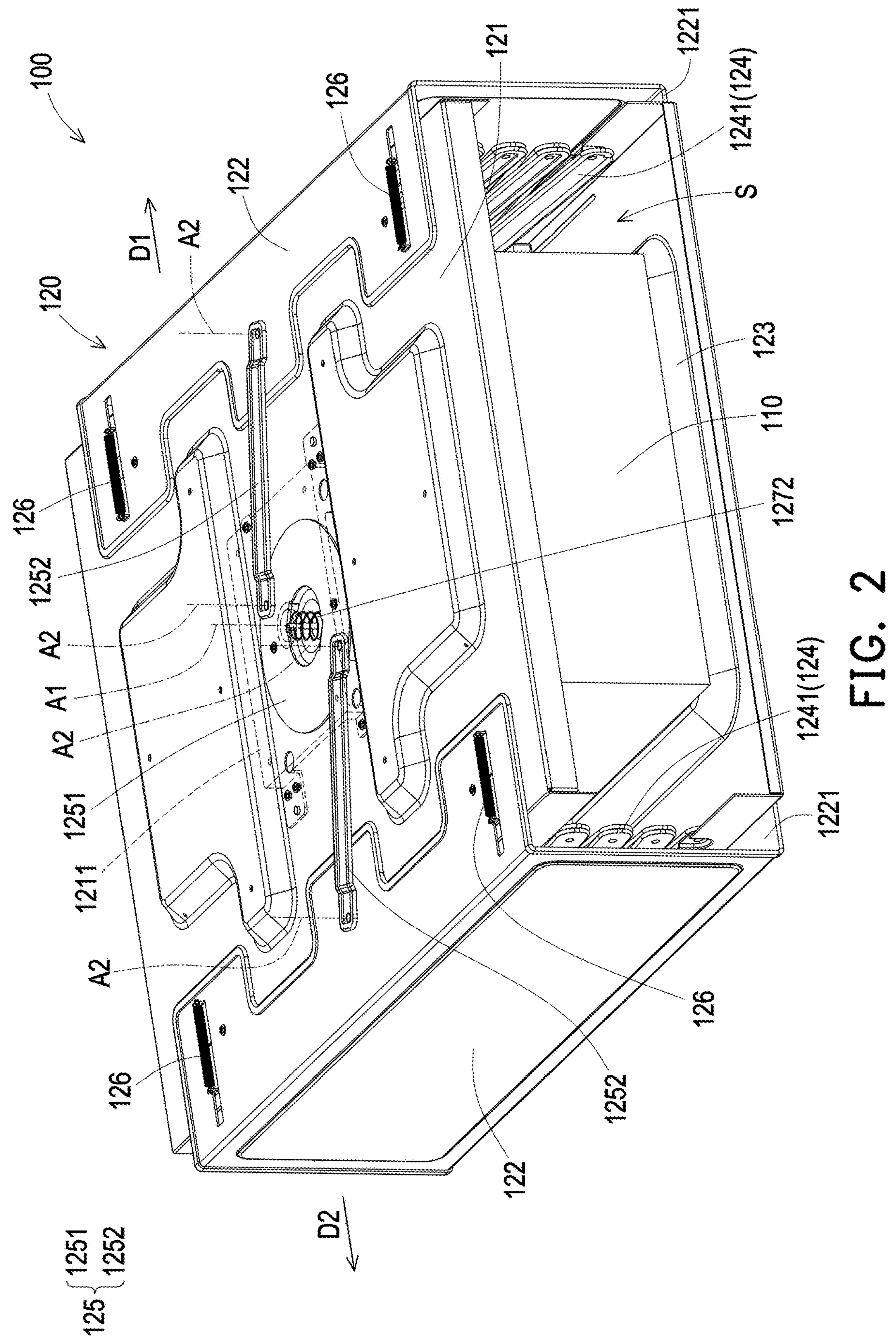
FIG. 2 is a three-dimensional view of the electronic device of FIG. 1A.
Figure 3:
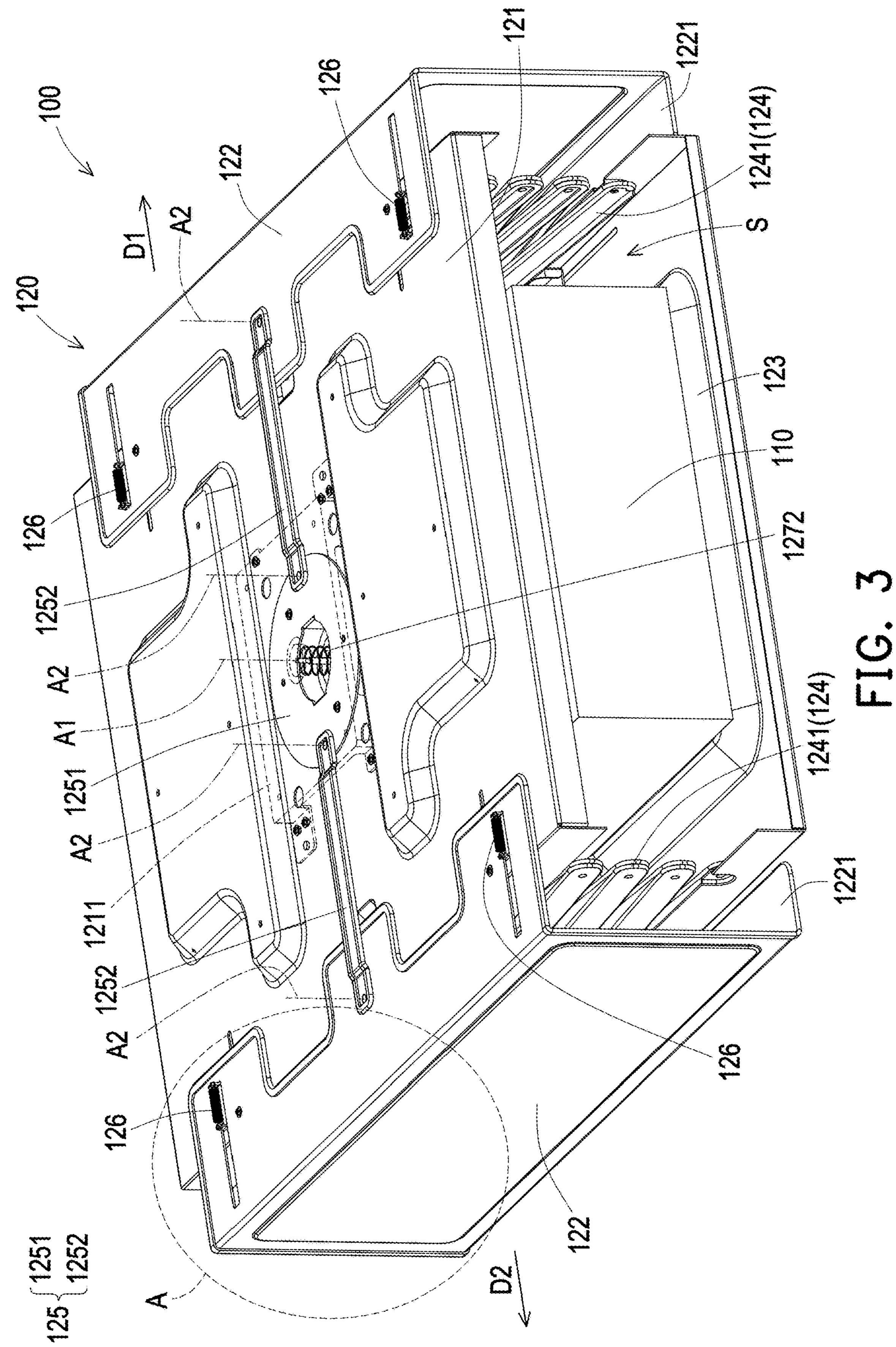
FIG. 3 is a three-dimensional view of the electronic device of FIG. 1D.
Figure 4:
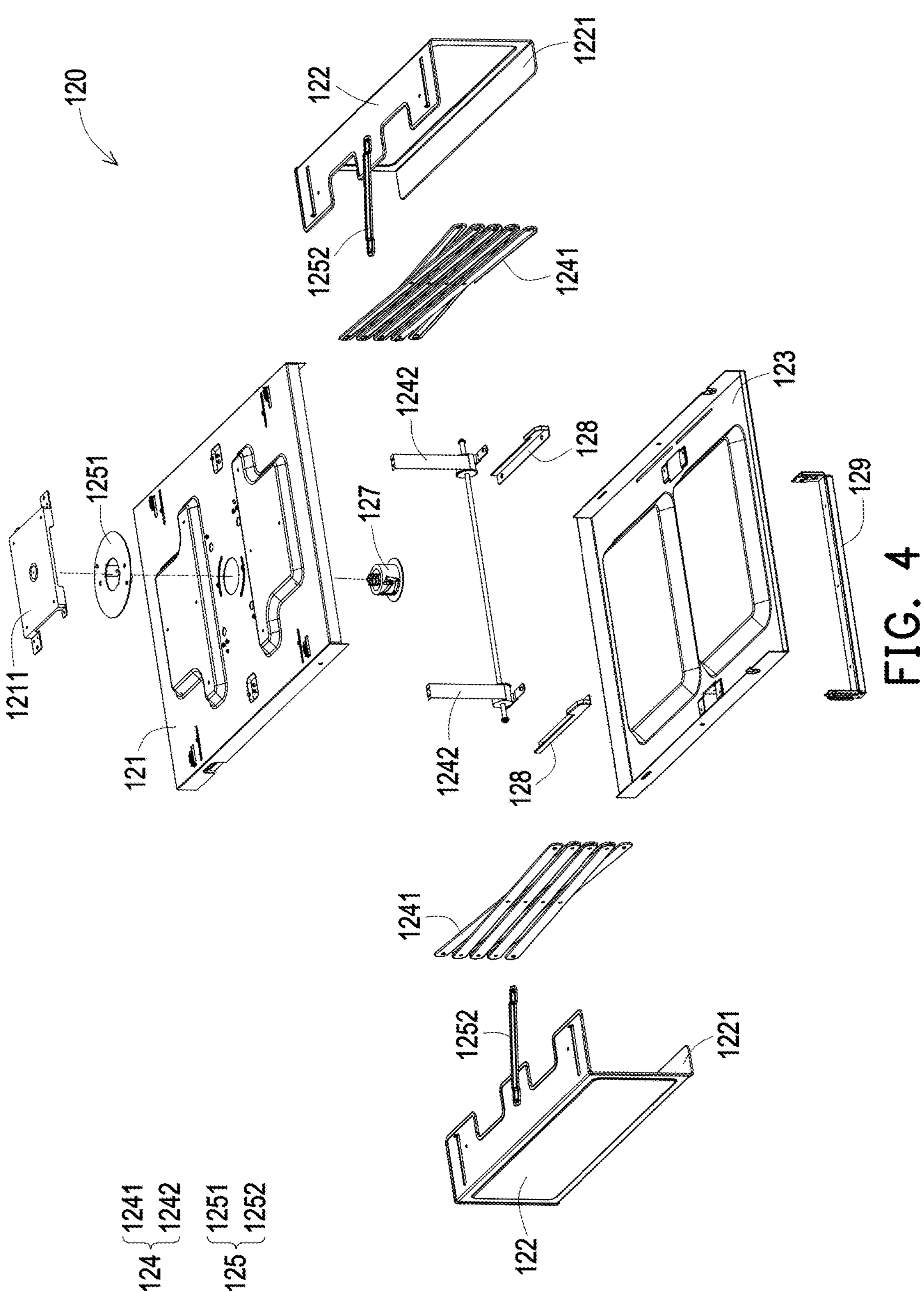
FIG. 4 is an exploded view of a suspension rack of FIG. 2.

FIG. 2 is a three-dimensional view of the electronic device of FIG. 1A. FIG. 3 is a three-dimensional view of the electronic device of FIG. 1D. FIG. 4 is an exploded view of a suspension rack of FIG. 2. In order to clearly illustrate the structure of the suspension rack 120, an upper supporting member 1211 in FIG. 2 and FIG. 3 is shown in a perspective manner. With reference to FIG. 2 to FIG. 4, in this embodiment, the suspension rack 120 provided by this embodiment includes the supporting member 121, two brackets 122, a tray 123, an adjusting mechanism 124, and a linkage mechanism 125. The two brackets 122 are slidably disposed on opposite sides of the supporting member 121 and are used to slide relative to the supporting member 121 to move away from or to be close to each other. Each of the brackets 122 is provided with a carrying portion 1221. An accommodating space S is formed between the carrying portion 1221 and the supporting member 121. The tray 123 is used to be supported by the carrying portions 1221 of the two brackets 122 in the accommodating space S and supports the object 110.

Figure 1B:
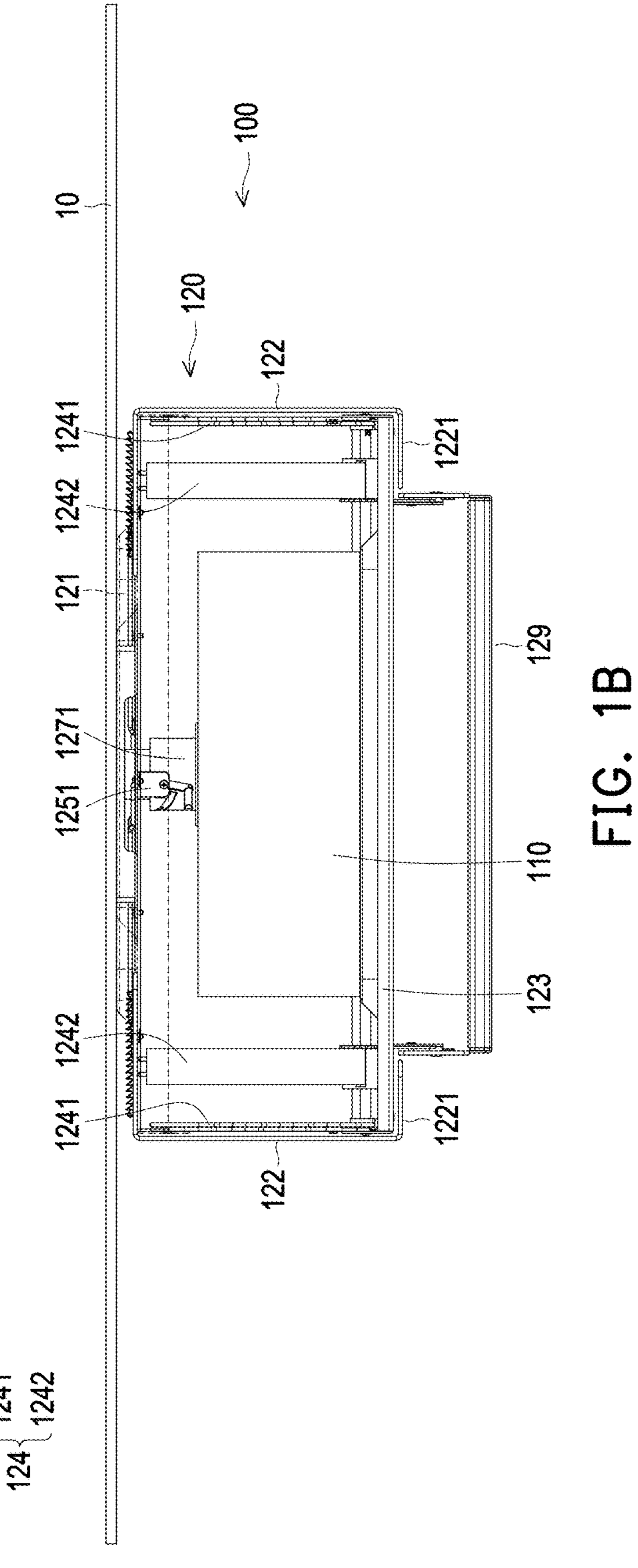
Figure 1C:
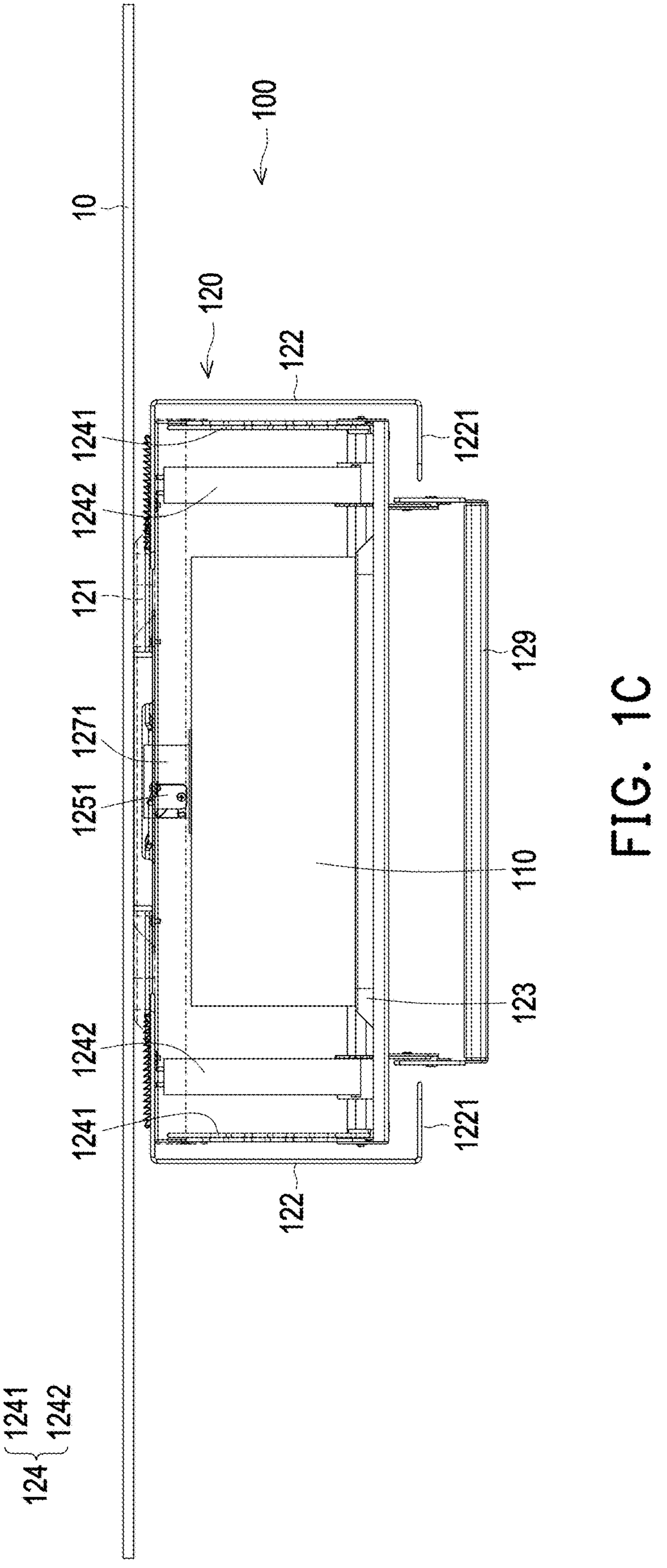
Figure 5A:
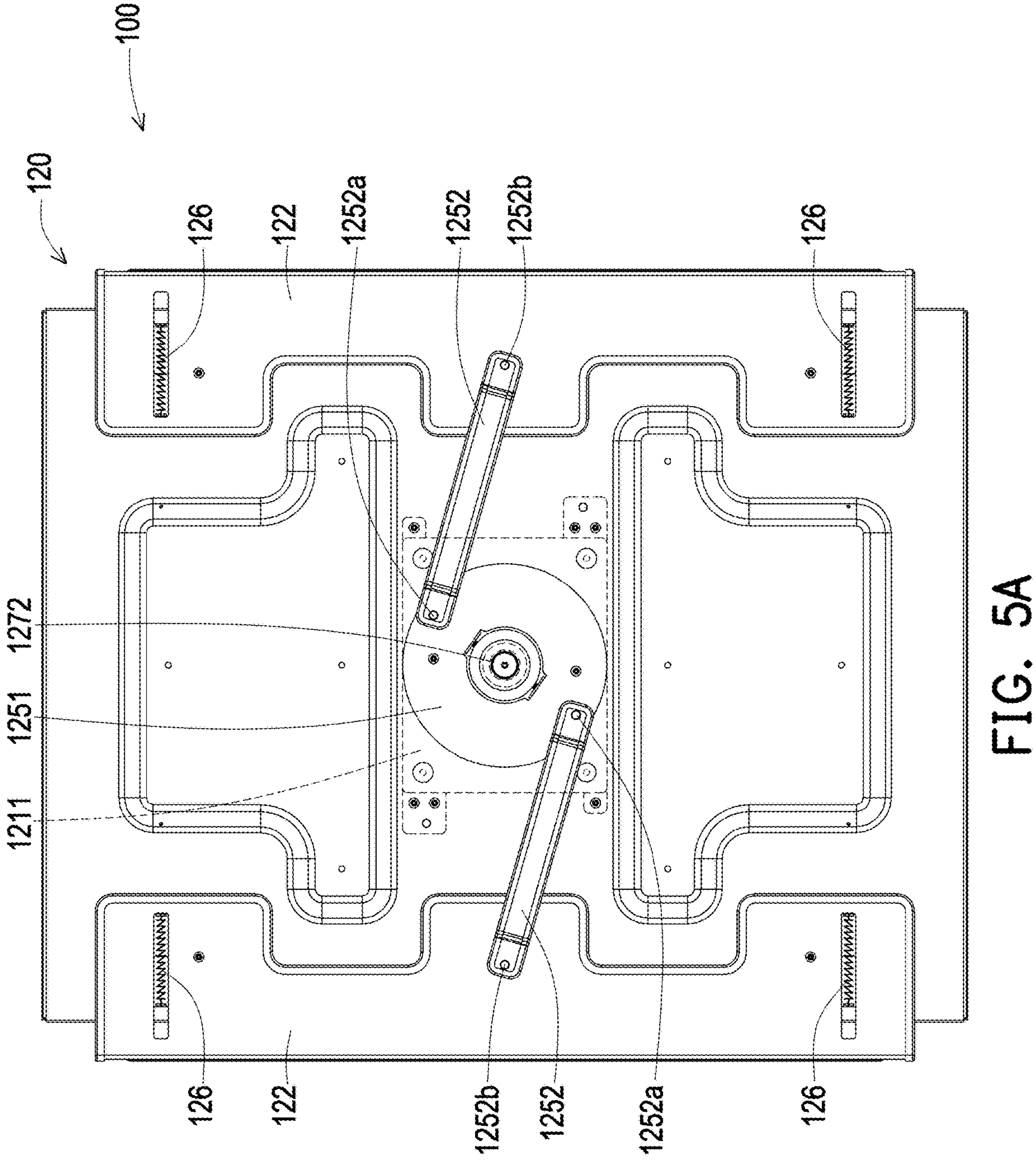
FIG. 5A to FIG. 5D are top views of FIG. 1A to FIG. 1D, respectively.
Figure 5B:
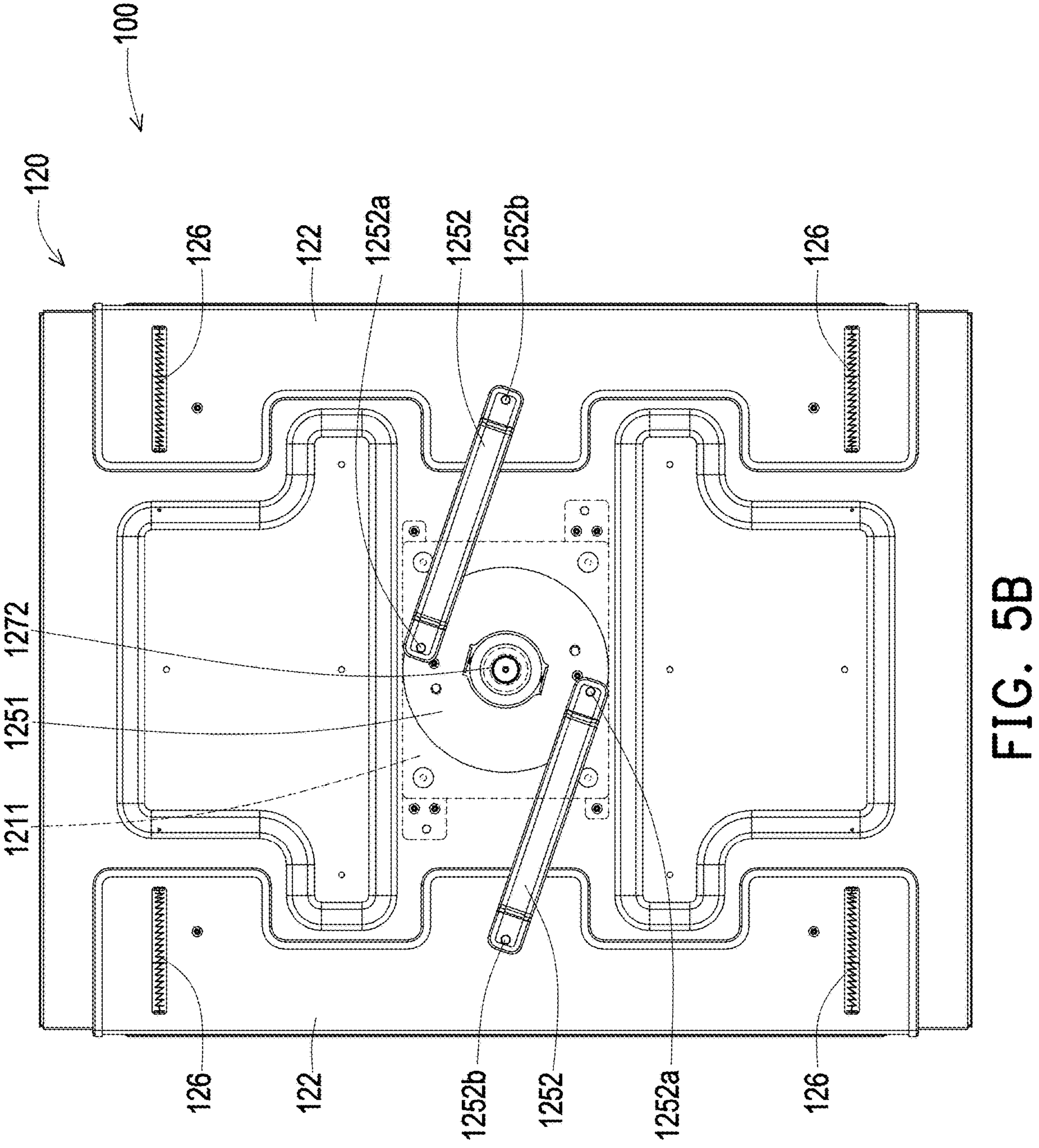
Figure 5C:
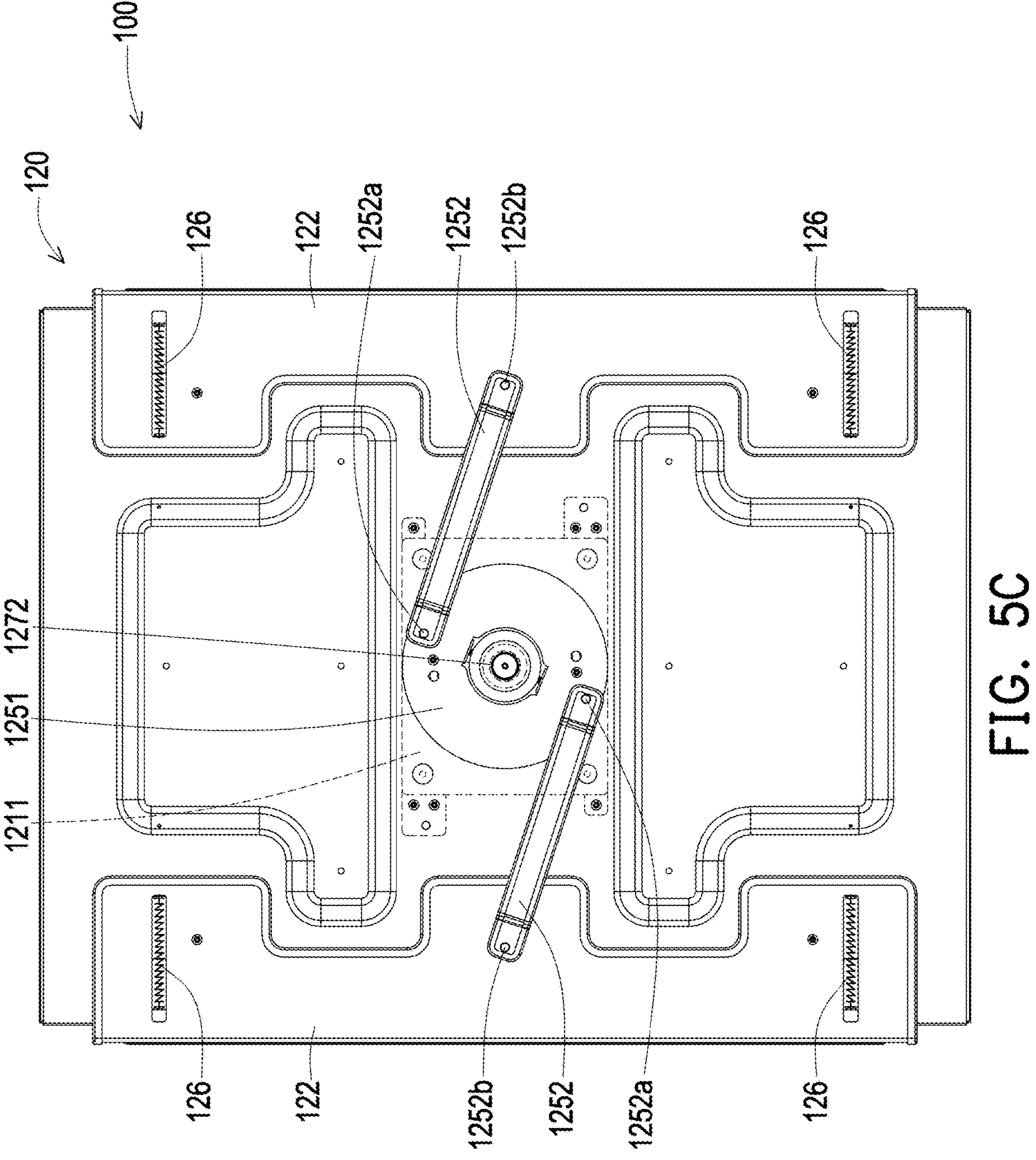
Figure 5D:
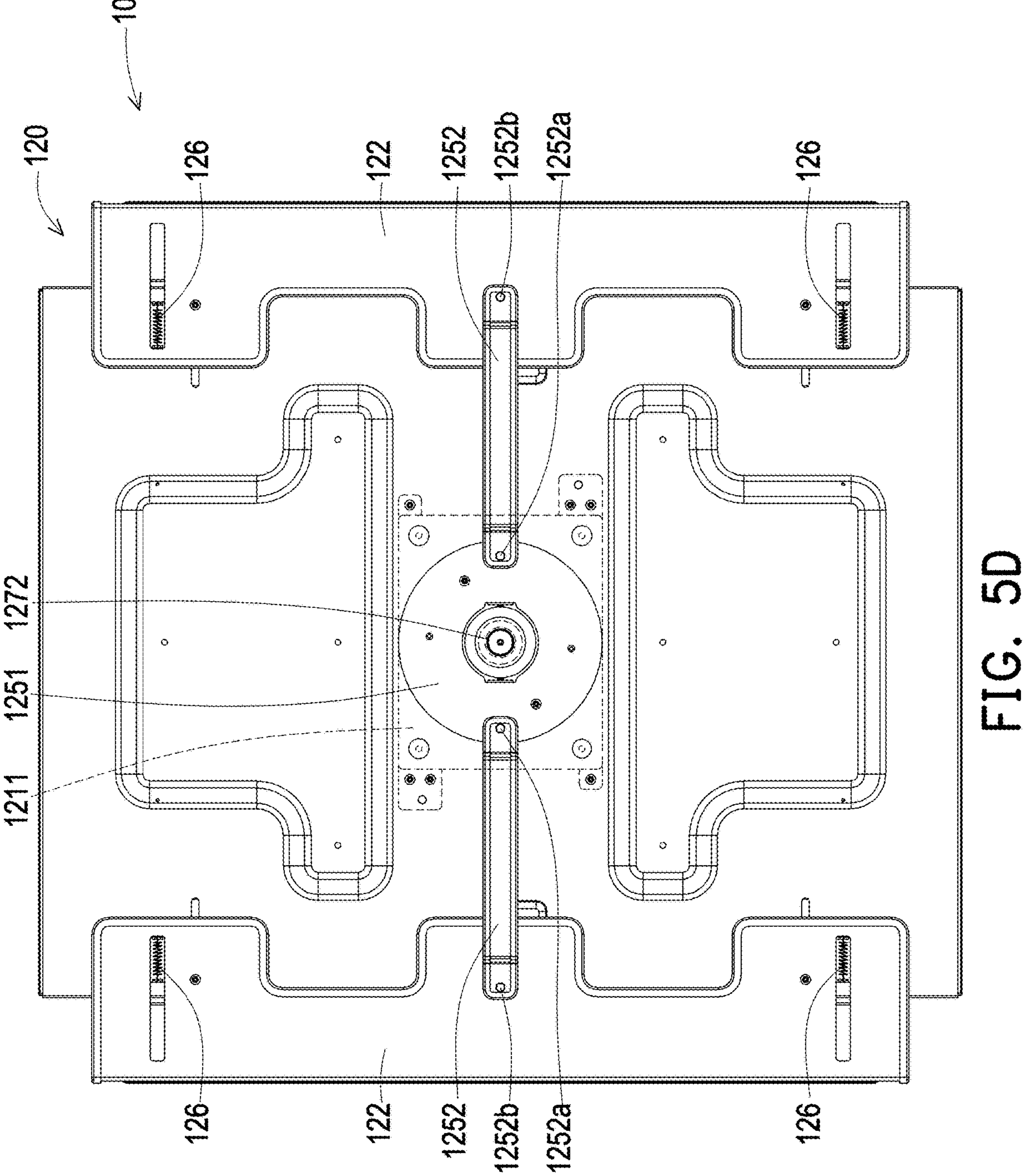
Figure 6:
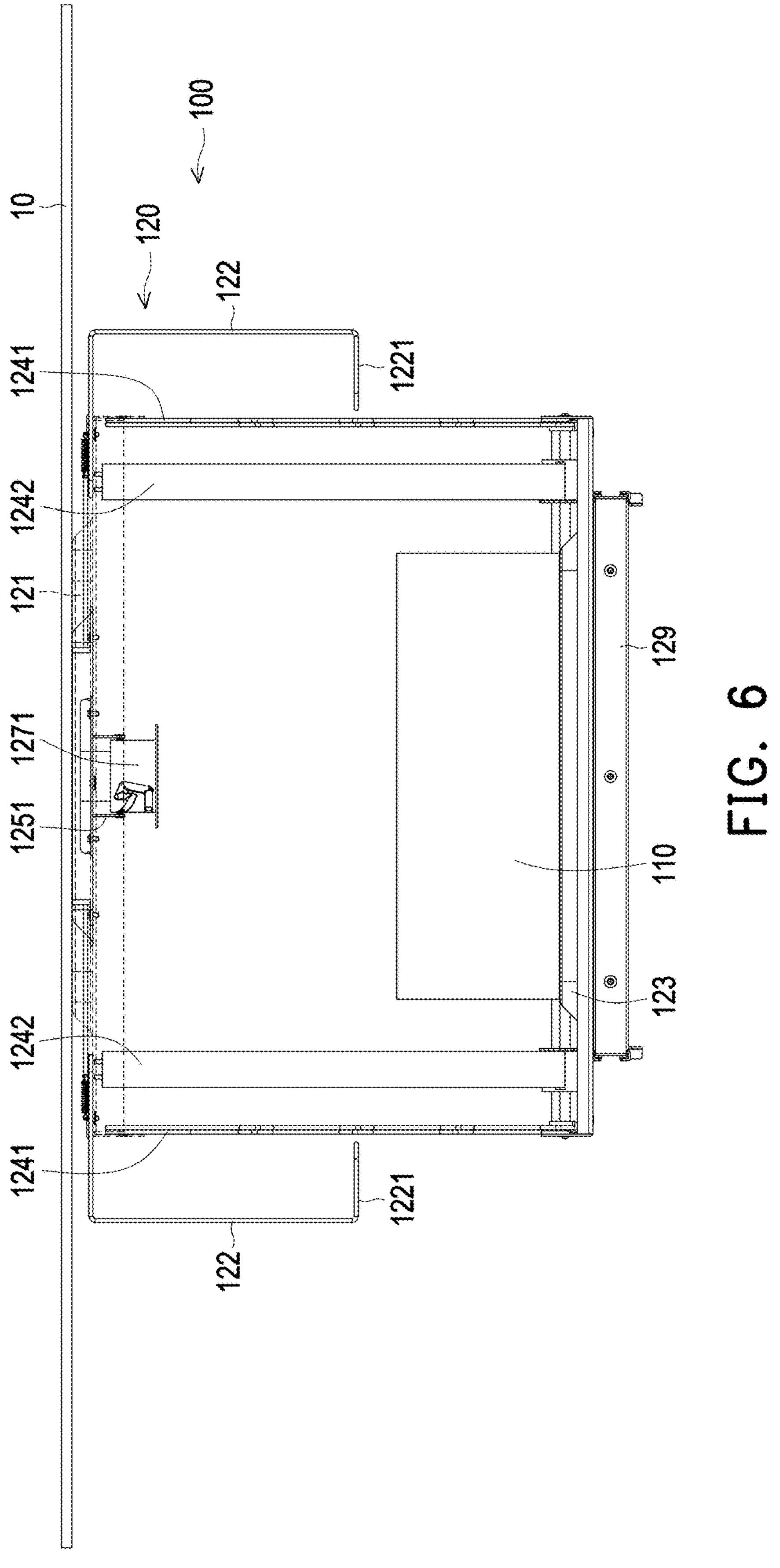
FIG. 6 illustrates an operation of an adjusting mechanism FIG. 1D.

FIG. 5A to FIG. 5D are top views of FIG. 1A to FIG. 1D, respectively. FIG. 6 illustrates an operation of an adjusting mechanism FIG. 1D. With reference to FIG. 1D, FIG. 5D, and FIG. 6, the adjusting mechanism 124 is connected between the supporting member 121 and the tray 123. The linkage mechanism 125 includes a rotating member 1251 and two linking bars 1252. The rotating member 1251 is rotatably disposed on the supporting member 121. One end 1252*a* of each of the linking bars 1252 is pivotally connected to the rotating member 1251, and the other end 1252*b* of each of the linking bars 1252 is pivotally connected to the corresponding bracket 122. The rotating member 1251 is used to rotate relative to the supporting member 121, so that each linking bar 1252 drives the corresponding bracket 122 to slide relative to the supporting member 121. When the linkage mechanism 125 drives the two brackets 122 to slide relative to the supporting member 121 to a carrying position shown in FIG. 1A, the carrying portion 1221 is used to store the object 110 in the accommodating space S through the tray 123. Further, when the linkage mechanism 125 drives the two brackets 122 to slide relative to the supporting member 121 to a release position as shown in FIG. 1D, the adjusting mechanism 124 drives the tray 123 to be lifted or lowered relative to the supporting member 121, so as to drive the tray 123 and the object 110 to pass downwardly over the carrying portion 1221 and leave the accommodating space S as shown in FIG. 6 or to pass upwardly over the carrying portion 1221 and enter the accommodating space S.

As described above, in the electronic device 100 and the suspension rack 120 provided by this embodiment, when the rotating member 1251 of the linkage mechanism 125 rotates relative to the supporting member 121, the linking bar 1252 pivotally connected to the rotating member 1251 is synchronously driven and further drives the bracket 122, so that the bracket 122 slides relative to the supporting member 121. A user may store the object 110 in the accommodating space S or take the object 110 out of the accommodating space S according to the positions of the brackets 122 relative to the supporting member 121. In this embodiment, the suspension rack 120 further includes the adjusting mechanism 124 to drive the tray 123 to be lifted and lowered. In such an operating mechanism, a space occupied by the suspension rack 120 may be reduced, and the user may operate the suspension rack 120 conveniently.

In this embodiment, the brackets 122 and the tray 123 are formed by, for example, sheet metal stamping, but the forming method of the brackets 122 and the tray 123 is not limited thereto.

In this embodiment, as shown in FIG. 2, a rotation axis A1 of the rotating member 1251 is parallel to pivot axes A2 of the linking bars 1252, but the disclosure is not limited thereto. In addition, in this embodiment, sliding directions D1 and D2 of the two brackets 122 are perpendicular to the rotation axis A1 of the rotating member 1251. In this embodiment, such an arrangement enables the two brackets 122 to exhibit improved support and stably carry the tray 123. However, in the disclosure, a relationship between the sliding directions D1 and D2 of the brackets 122 and the rotation axis A1 of the rotating member 1251 is not limited.

Figure 7:
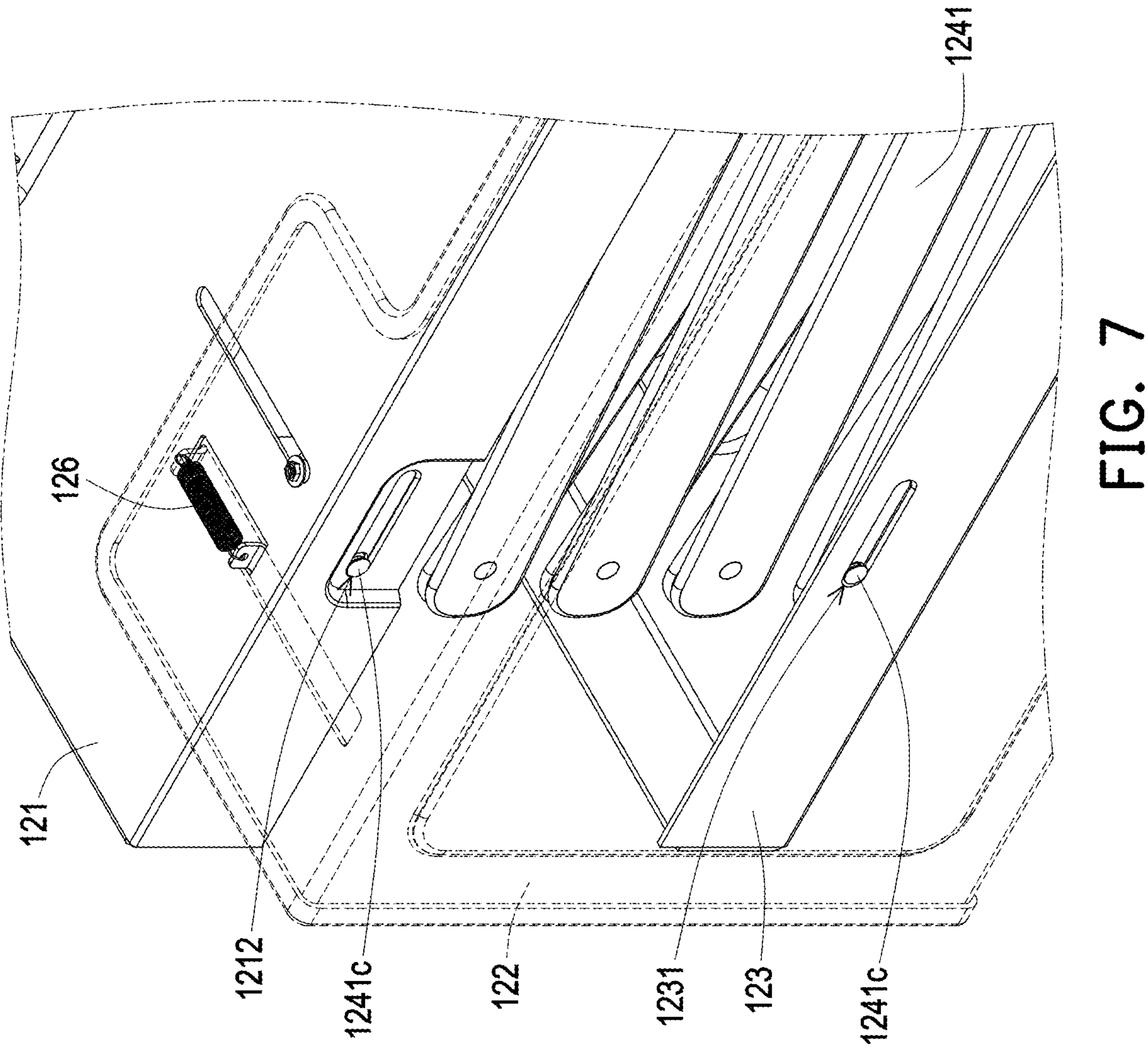
FIG. 7 is a partial enlarged view of a region A of the suspension rack of FIG. 3.

FIG. 7 is a partial enlarged view of a region A of the suspension rack of FIG. 3. In order to clearly illustrate structures of the supporting member 121 and the brackets 122, the bracket 122 in FIG. 7 is shown in a perspective manner. With reference to FIG. 3 and FIG. 7, the suspension rack 120 further includes four elastic members 126. The four elastic members 126 are disposed at opposite ends of the two brackets 122, and each elastic member 126 is connected between the bracket 122 and the supporting member 121 as shown in FIG. 7.

When the two brackets 122 slide from the release position as shown in FIG. 3 to the carrying position as shown in FIG. 2, the brackets 122 are used to resist elastic forces of the elastic members 126 and slide relative to the supporting member 121. On the contrary, the brackets 122 are used to be restored from the carrying position shown in FIG. 2 to the release position shown in FIG. 3 by the elastic forces of the elastic members 126. In this embodiment, the elastic members 126 are tension springs, for example, but the disclosure is not limited to the type of the elastic members 126.

Figure 8:
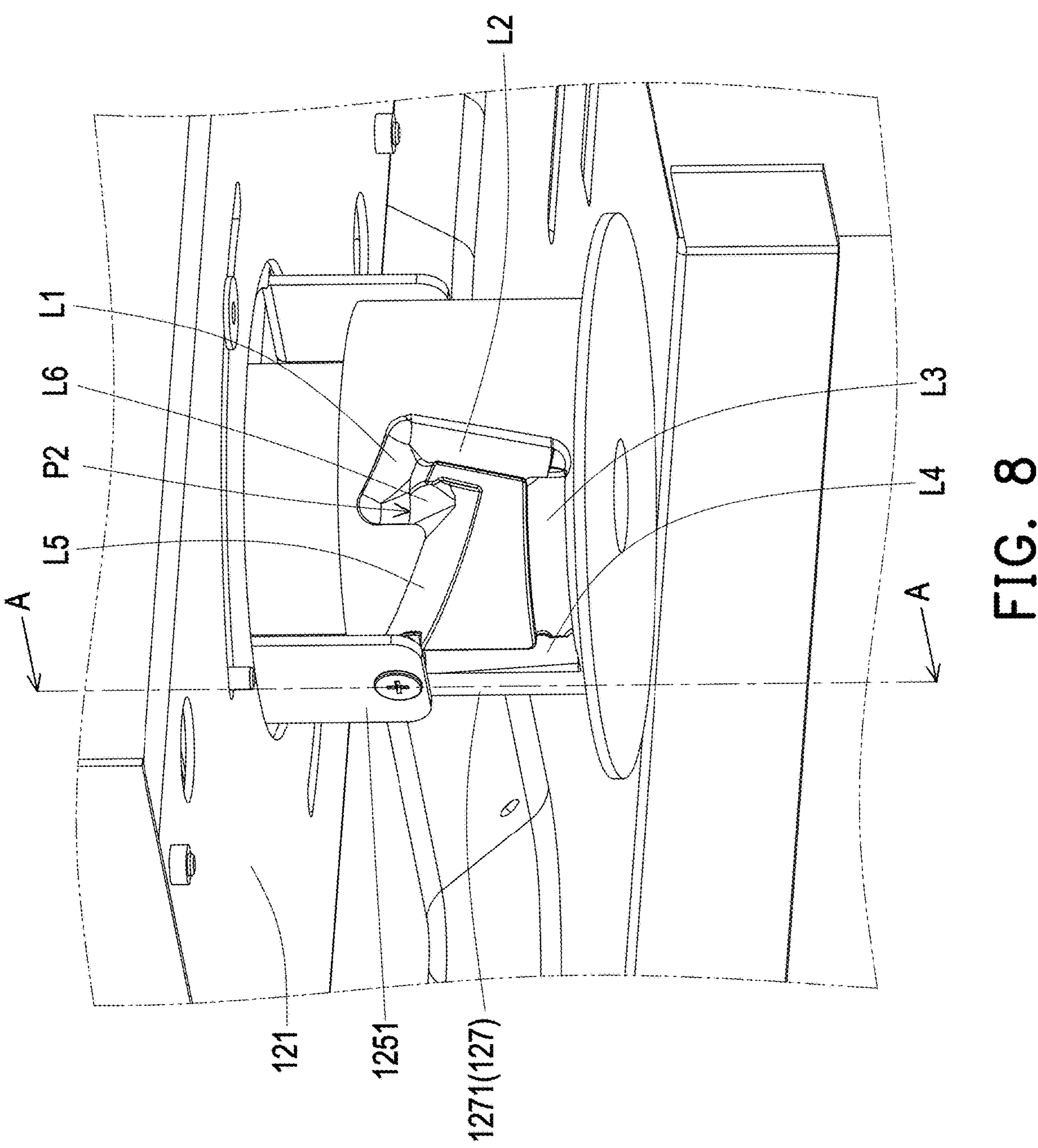
FIG. 8 is a partial enlarged view of a push-push mechanism of FIG. 1D at different viewing angles.
Figure 9:
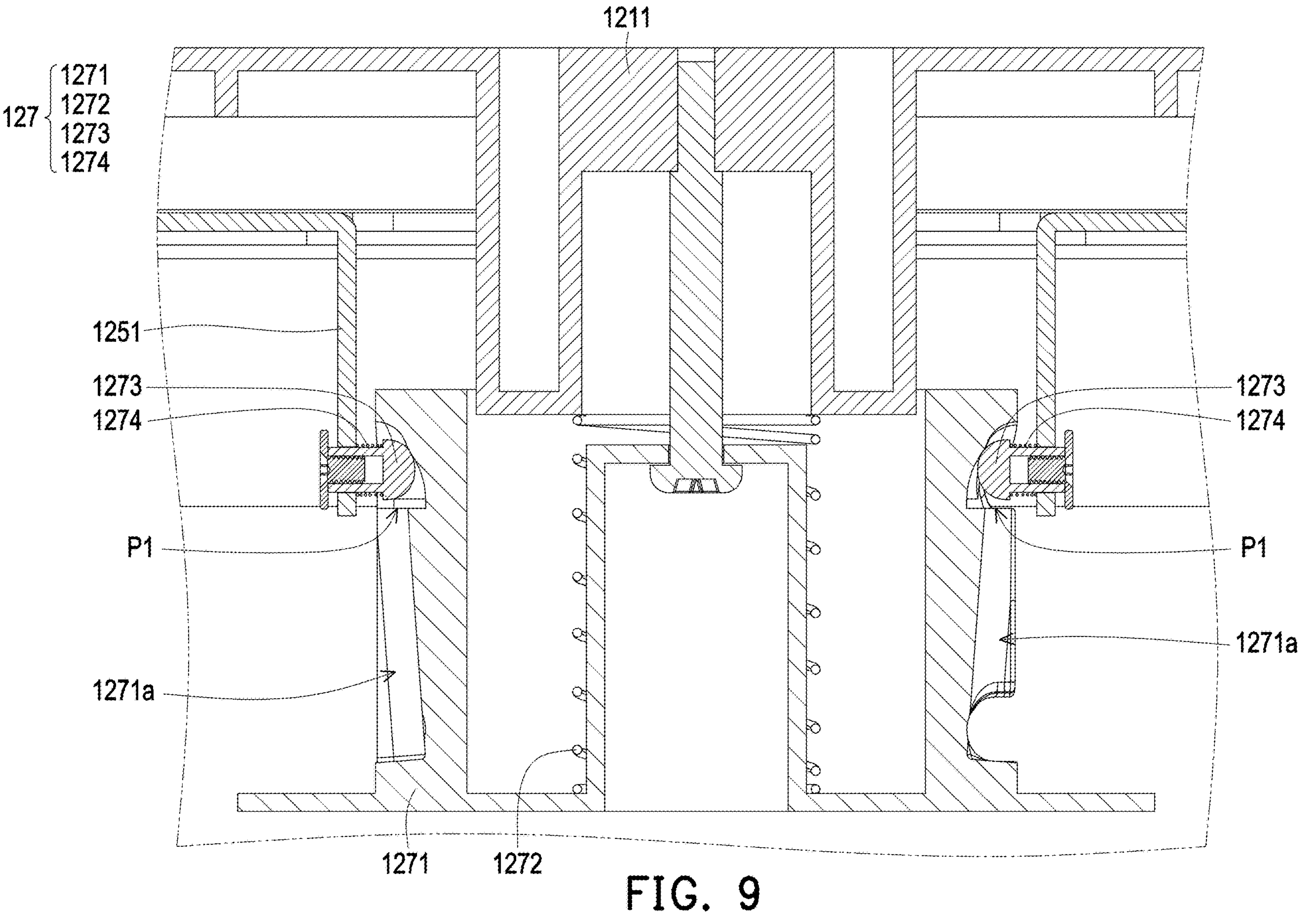
FIG. 9 is a cross-sectional view of the push-push mechanism of FIG. 8 along a line A-A.

FIG. 8 is a partial enlarged view of a push-push mechanism of FIG. 1D at different viewing angles. FIG. 9 is a cross-sectional view of the push-push mechanism of FIG. 8 along a line A-A. With reference to FIG. 8 and FIG. 9, the suspension rack 120 further includes a push-push mechanism 127 connected to the rotating member 1251, and the rotating member 1251 is driven to rotate by the push-push mechanism 127. A structure of the push-push mechanism 127 is described in detail in the following paragraphs.

Figure 10:
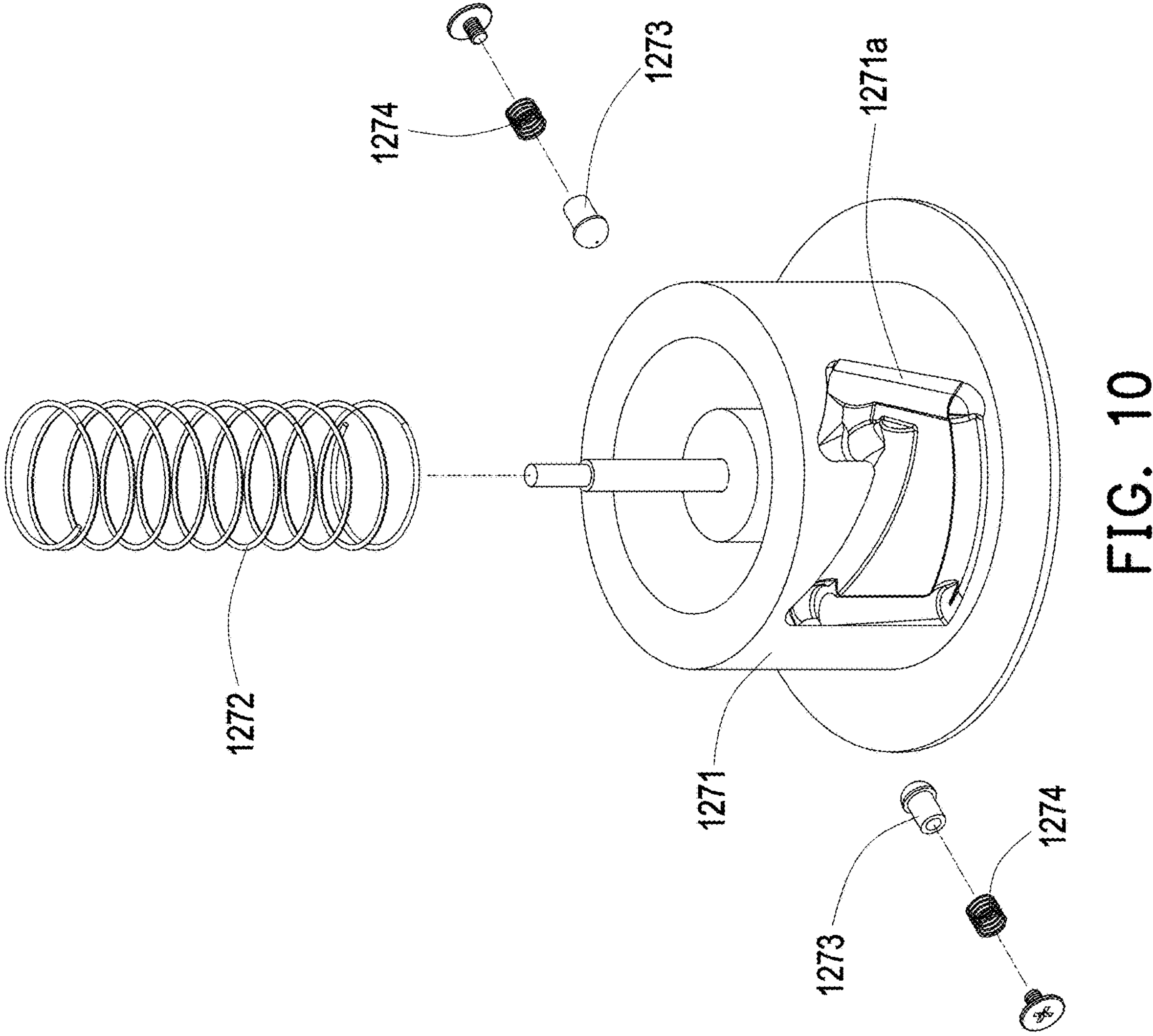
FIG. 10 is an exploded view of the push-push mechanism of FIG. 8.
Figure 11A:
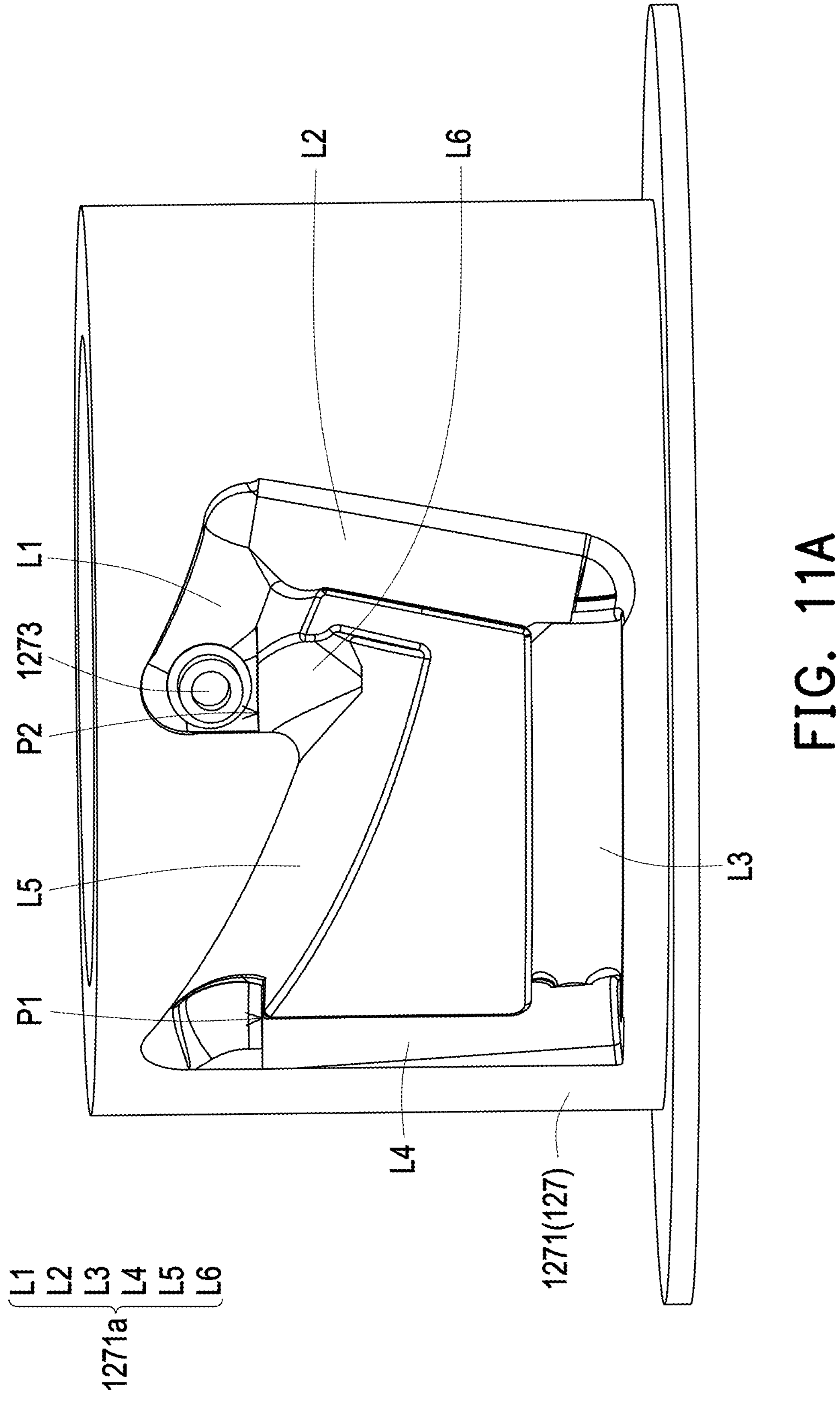
FIG. 11A to FIG. 11E are schematic views of a movable member and a column of FIG. 1A to FIG. 1E, respectively.
Figure 11B:
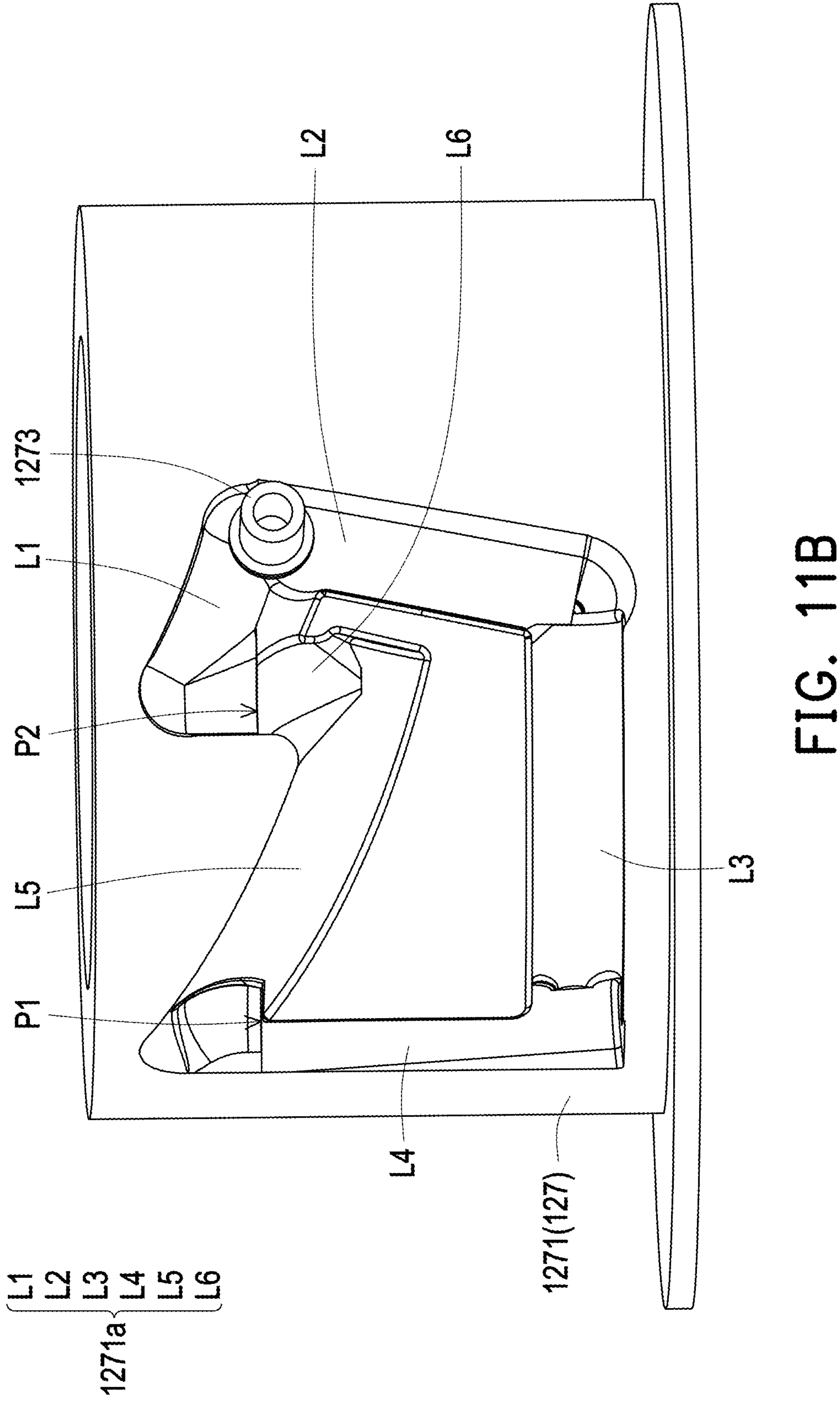
Figure 11C:
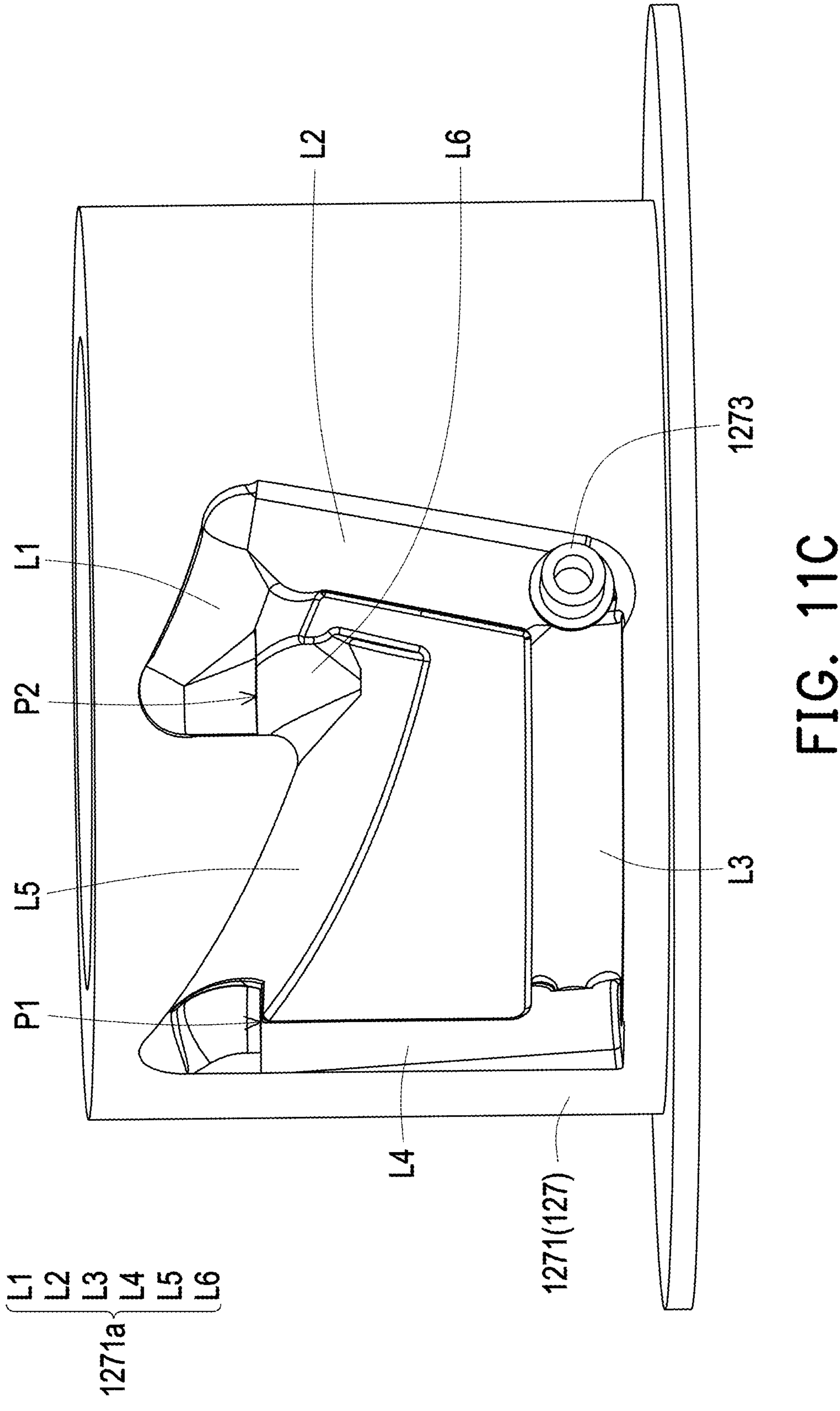
Figure 11D:
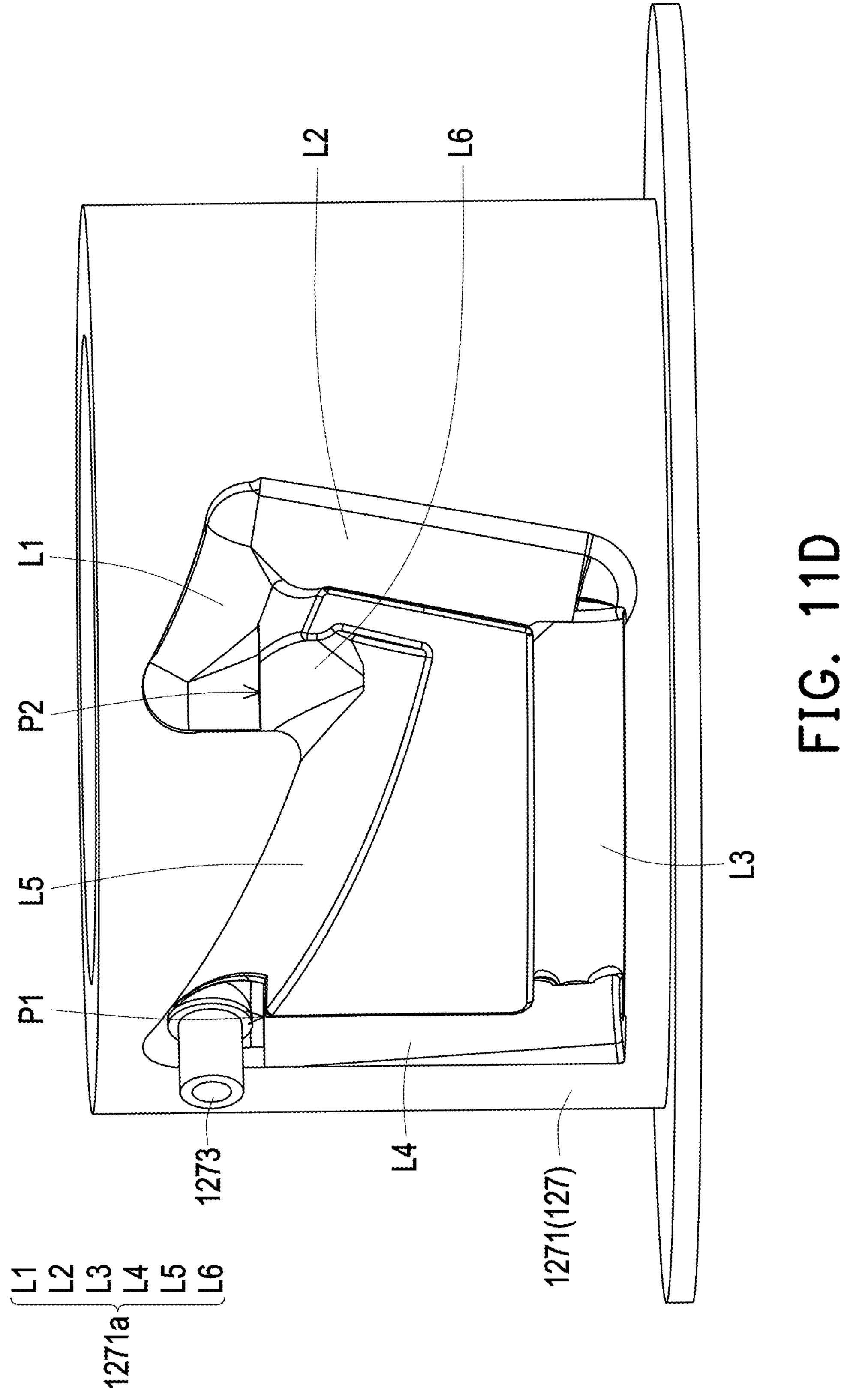
Figure 11E:
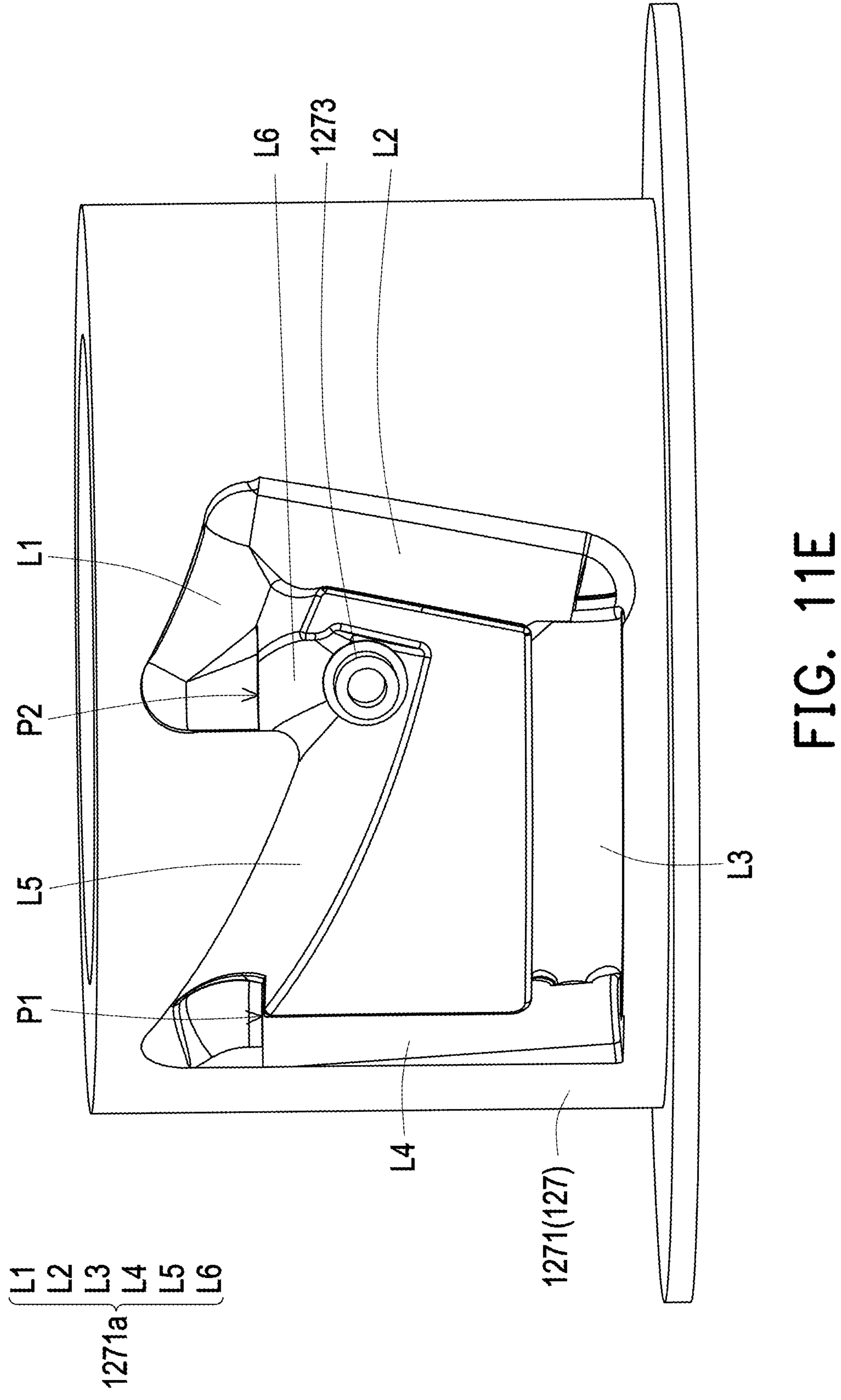

FIG. 10 is an exploded view of the push-push mechanism of FIG. 8. With reference to FIG. 8 to FIG. 10, the push-push mechanism 127 includes a movable member 1271, an elastic member 1272, and two column 1273. The movable member 1271 is provided with a guiding groove 1271*a*. The elastic member 1272 is connected between the movable member 1271 and the upper supporting member 1211 of the supporting member 121. As shown in FIG. 9, the columns 1273 are connected to the rotating member 1251 and extend into the guiding groove 1271*a*. The movable member 1271 is used to be moved upwardly and subjected to a force to resist an elastic force of the elastic member 1272 and the movable member 1271 is moved downwardly through the elastic force of the elastic member 1272.

With reference to FIG. 9 and FIG. 10, the push-push mechanism 127 further includes two elastic members 1274. As shown in FIG. 9, each elastic member 1274 is disposed between the corresponding column 1273 and the rotating member 1251. Further, the elastic member 1274 presses the column 1273 into the guiding groove 1271*a*, so that the column 1273 may be pressed against the guiding groove 1271*a*.

With reference to FIG. 8, the guiding groove 1271*a* includes six sections L1 to L6, and three sections L1, L2, and L5 among the six sections L1 to L6 are inclined sections. The column 1273 is moved along the inclined sections L1, L2, and L5 as the movable member 1271 is driven to rotate by the rotating member 1251. In addition, the guiding groove 1271*a* is provided with two step difference portions P1 and P2 (shown in FIG. 8 and FIG. 9 respectively). A moving direction of the column 1273 in the guiding groove 1271*a* is limited by the step difference portions P1 and P2, so that the column 1273 may move in the order of the above-mentioned sections L1 to L6.

An operation process of the push-push mechanism 127 is described in detail in the following paragraphs.

FIG. 11A to FIG. 11E are schematic views of a movable member and a column of FIG. 1A to FIG. 1E, respectively. As shown in FIG. 1A, when the user takes the object 110 out of the accommodating space S, first, the user has to apply a force to the movable member 1271 through the object 110 to resist the elastic force of the elastic member 1272, so that the movable member 1271 moves upwardly from the position shown in FIG. 1A to the position shown in FIG. 1B. During the process of the movable member 1271 moving from the position shown in FIG. 11A to the position shown in FIG. 11B, the column 1273 moves along the inclined section L1, causing the rotating member 1251 to rotate counterclockwise from the position shown in FIG. 5A to the position shown in FIG. 5B, and at this time the bracket 122 leaves the carrying position.

Next, the user continues to apply the force upwardly, and the movable member 1271 continues to move upwardly from the position shown in FIG. 1B to the position shown in FIG. 1C. During the process of the movable member 1271 moving from the position shown in FIG. 11B to the position shown in FIG. 11C, the column 1273 moves along the inclined section L2, causing the rotating member 1251 to rotate clockwise from the position shown in FIG. 5B to the position shown in FIG. 5C.

Next, the suspension rack 120 restores the brackets 122 to the release position shown in FIG. 1D due to the elastic forces of the elastic members 126. During the process of restoring the brackets 122, the rotating member 1251 rotates clockwise from the position shown in FIG. 5C to the position shown in FIG. 5D, and the column 1273 moves along the section L3.

When the brackets 122 are located at the release position, the user may take the tray 123 and the object 110 out of the accommodating space S. When the object 110 no longer abuts against the movable member 1271, the movable member 1271 restores to the position shown in FIG. 1D due to the elastic force of the elastic member 1272, and the column 1273 synchronously moves along the section LA and stops at the step difference portion P1.

Figure 1E:
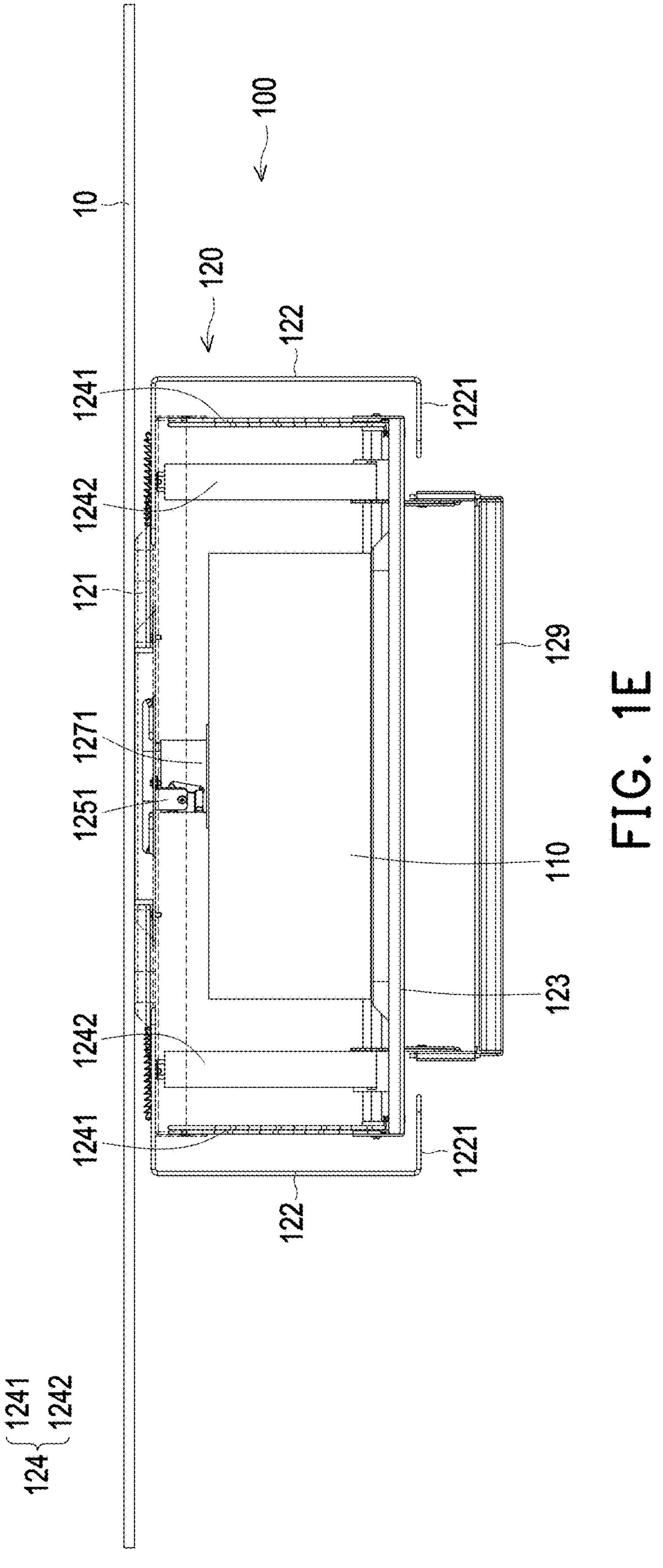

When the user stores the object 110 in the accommodating space S, first, the user has to apply a force to the movable member 1271 through the object 110 to resist the elastic force of the elastic member 1272, so that the movable member 1271 moves upwardly from the position shown in FIG. 1D to the position shown in FIG. 1E. During the process of the movable member 1271 moving from the position shown in FIG. 11D to the position shown in FIG. 11E, the column 1273 moves along the inclined section L5, causing the rotating member 1251 to rotate counterclockwise from the position shown in FIG. 5D to the position shown in FIG. 5A, and the rotating member 1251 synchronously drives the linking bars 1252, so that the two brackets 122 are further driven to be close to each other.

Next, when the user removes the applied force, the tray 123 moves downwardly and is carried by the carrying portions 1221 of the two brackets 122. When the object 110 no longer abuts against the movable member 1271, the movable member 1271 is subjected to the elastic force of the elastic member 1272 and restore downwardly from the position shown in FIG. 1E to the position shown in FIG. 1A. When the movable member 1271 moves, the column 1273 moves along the section L6.

In this embodiment, the movable member 1271 may be restricted by an appropriate structure, so that it can only move up and down relative to the upper supporting member 1211. As described above, when the movable member 1271 moves up and down, the column 1273 is moved along the guiding groove 1271*a*. Further, the rotating member 1251 connected to the column 1273 is synchronously driven, so that the rotating member 1251 rotates relative to the supporting member 121, and then the linking bars 1252 pivotally connected to the rotating member 1251 drive the brackets 122 to slide relative to the supporting member 121. Accordingly, the user may move the brackets 122 to the release position shown in FIG. 1D or the carrying position shown in FIG. 1A through a simple operation as described in the foregoing paragraphs.

A specific structure of the adjusting mechanism 124 is described in detail in the following paragraphs.

With reference to FIG. 1A, FIG. 4, and FIG. 6, the adjusting mechanism 124 includes two connecting bar assemblies 1241 and two elastic components 1242. The two connecting bar assemblies 1241 are connected between the supporting member 121 and the tray 123, are used to be extended and retracted to drive the tray 123 to be lifted and lowered, and may improve the support of the tray 123. The two elastic components 1242 are connected between the tray 123 and the supporting member 121 and are used to provide elastic forces to assist the tray 123 to be lifted.

Figure 12:
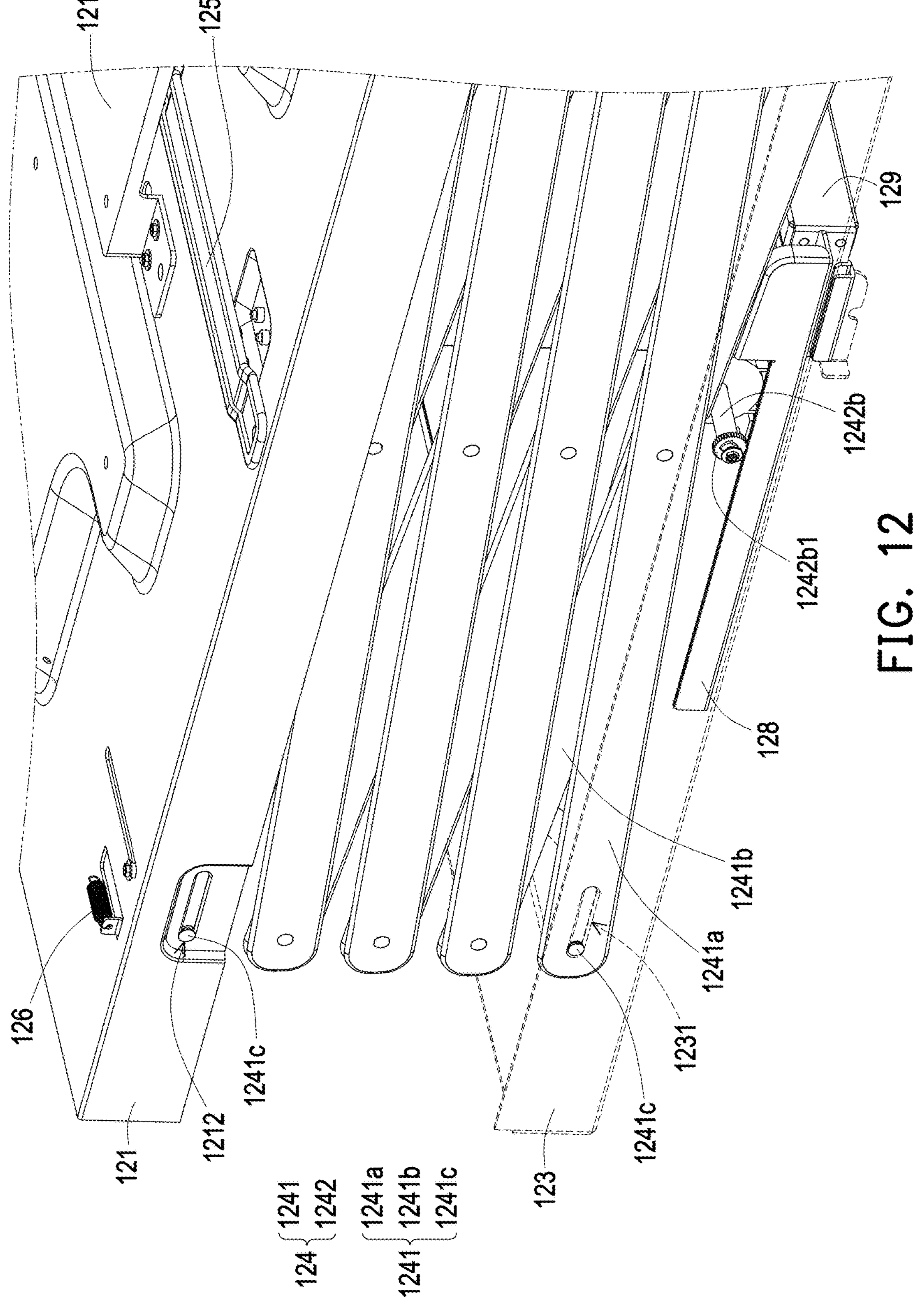
FIG. 12 is a partial enlarged view of a lateral side of the suspension rack of FIG. 2.
Figure 13:
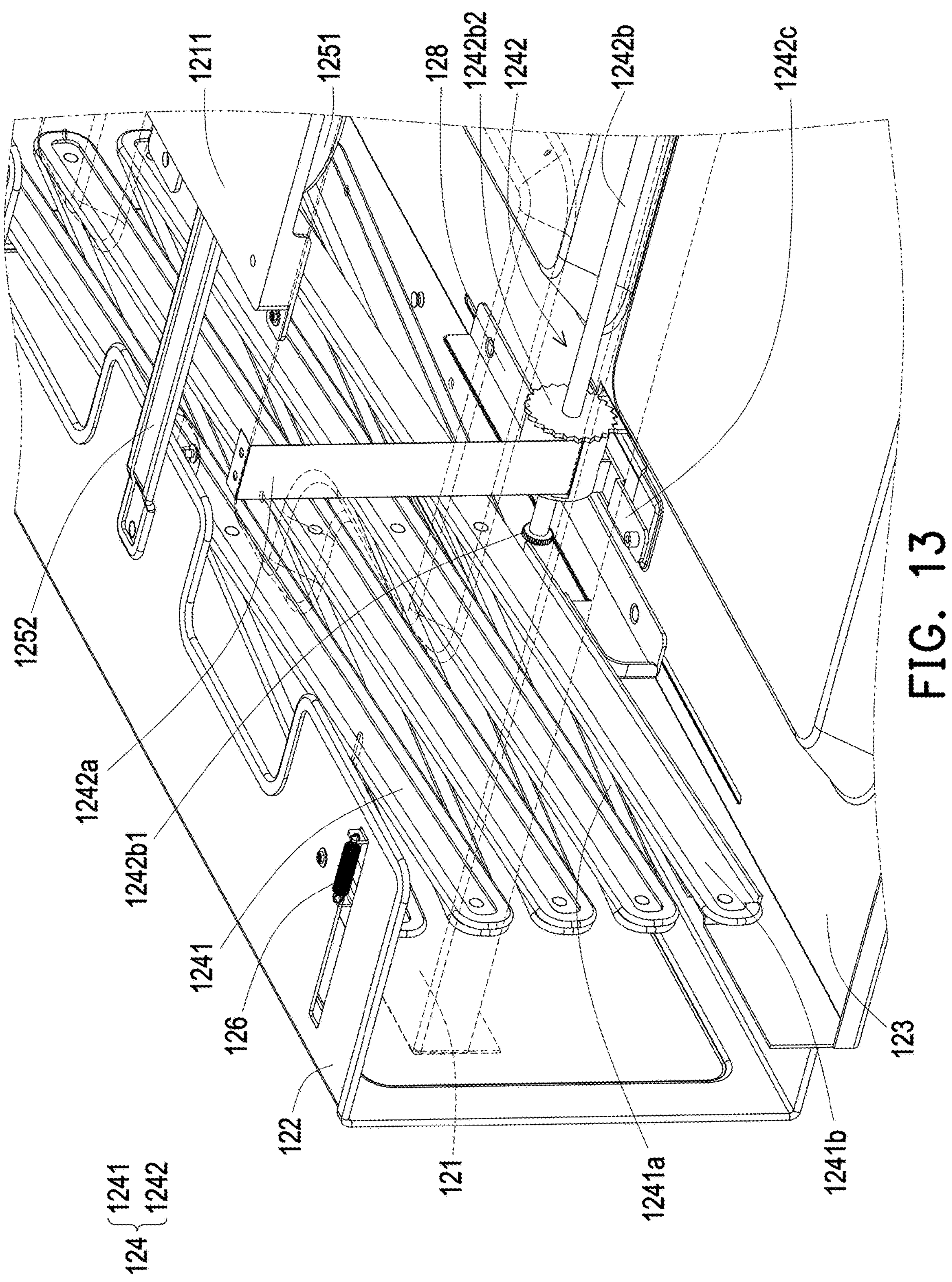
FIG. 13 is a schematic view of the suspension rack of FIG. 12 at different viewing angles.

FIG. 12 is a partial enlarged view of a lateral side of the suspension rack of FIG. 2. FIG. 13 is a schematic view of the suspension rack of FIG. 12 at different viewing angles. In order to clearly illustrate an internal structure of the suspension rack 120, the brackets 122 are not shown in FIG. 12 and the supporting member 121 of FIG. 13 is shown in a perspective manner. In detail, with reference to FIG. 12 and FIG. 13, each connecting bar assembly 1241 includes a plurality of first connecting bars 1241*a* and a plurality of second connecting bars 1241*b*. The first connecting bars 1241*a* are parallel to each other and the second connecting bars 1241*b* are parallel to each other, and the first connecting bars 1241*a* and the second connecting bars 1241*b* extend in different directions. In detail, two ends of each first connecting bar 1241*a* are connected to two second connecting bars 1241*b*, and two ends of each second connecting bar 1241*b* are connected to two first connecting bars 1241*a*. The plurality of first connecting bars 1241*a* and the plurality of second connecting bars 1241*b* are arranged in an overlapping manner to form an X shape.

Figure 14:
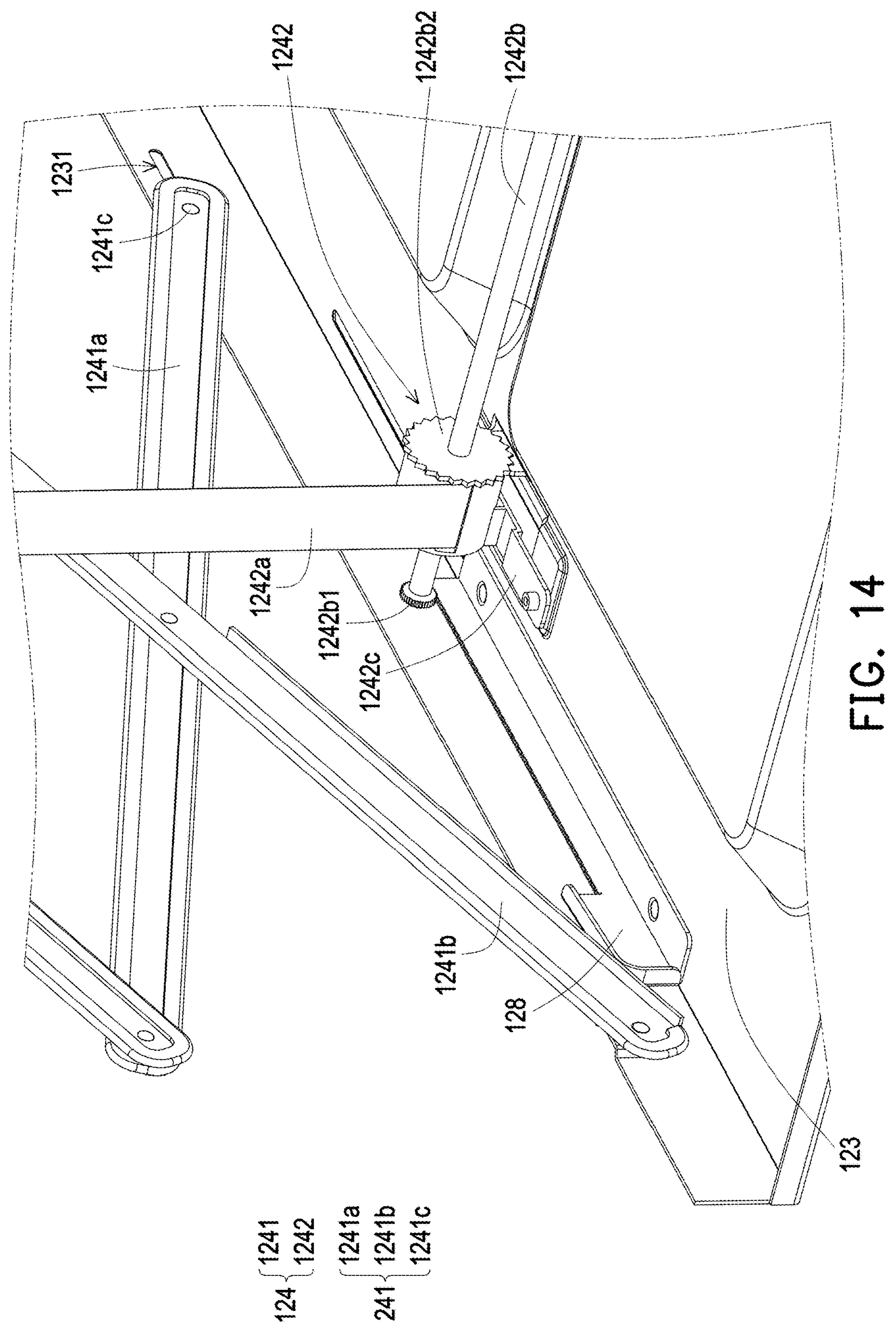
FIG. 14 illustrates operations of a first connecting bar and a second connecting bar of FIG. 13.

FIG. 14 illustrates operations of a first connecting bar and a second connecting bar of FIG. 13. With reference to FIG. 12 to FIG. 14, each connecting bar assembly 1241 further includes two fasteners 1241*c*. The two fasteners 1241*c* enable one of the first connecting bars 1241*a* to be slidably disposed in a sliding groove 1231 of the tray 123 and one of the second connecting bars 1241*b* to be slidably disposed in a sliding groove 1212 of the supporting member 121. During the extension and retraction process of each connecting bar assembly 1241, tilt angles of the first connecting bars 1241*a* and the second connecting bars 1241*b* change, and the two fasteners 1241*c* slide relative to the sliding groove 1212 and the sliding groove 1231.

Figure 15:
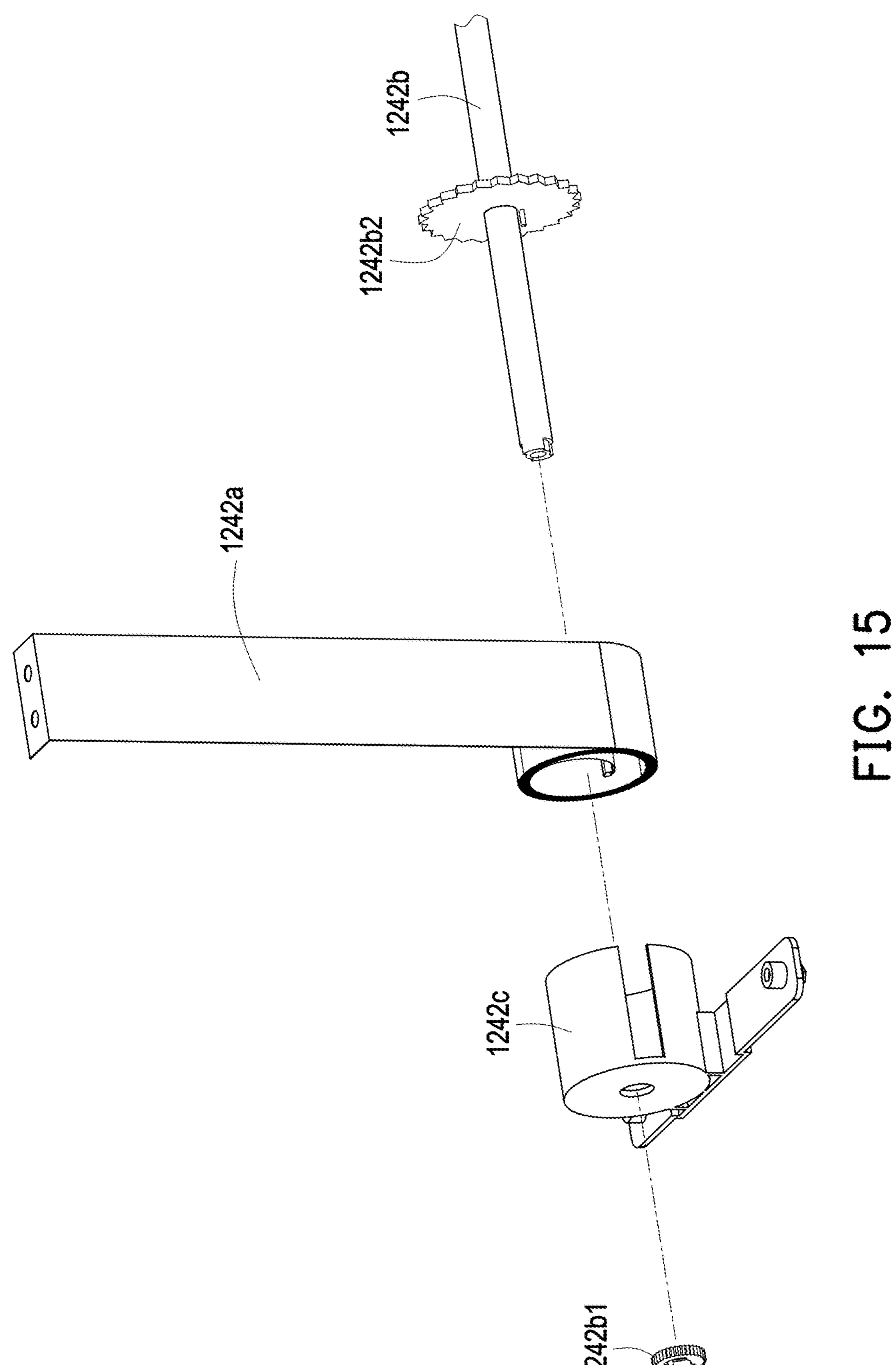
FIG. 15 is an exploded view of an elastic component of FIG. 4.

FIG. 15 is an exploded view of an elastic component of FIG. 4. With reference to FIG. 13 and FIG. 15, each elastic component 1242 includes a coil spring 1242*a*, a rotating shaft 1242*b*, and a seat body 1242*c*. As shown in FIG. 13, the seat body 1242*c* is connected to the tray 123, the rotating shaft 1242*b* is rotatably disposed on the seat body 1242*c*, and the coil spring 1242*a* is connected between the rotating shaft 1242*b* and the supporting member 121 and is at least partially wound around the rotating shaft 1242*b*. When the user applies a force to move the tray 123 downward, the coil spring 1242*a* extends as the tray 123 descends to slow down a descending speed of the tray 123, so that the user may operate safely. When the user applies a force to move the tray 123 upwardly, an elastic force of the coil spring 1242*a* may assist the tray 123 to ascend, so that the user's labor is saved.

In this embodiment, the rotating shafts 1242*b* of the elastic components 1242 are substantially the same rotating shaft, but the disclosure is not limited thereto. In this embodiment, the rotating shaft 1242*b* is formed by die-casting, for example, and a material of the seat body 1242*c* is, for example, plastic, but the molding method of the rotating shaft 1242*b* and the material of the seat body 1242*c* are not limited thereto.

Figure 16:
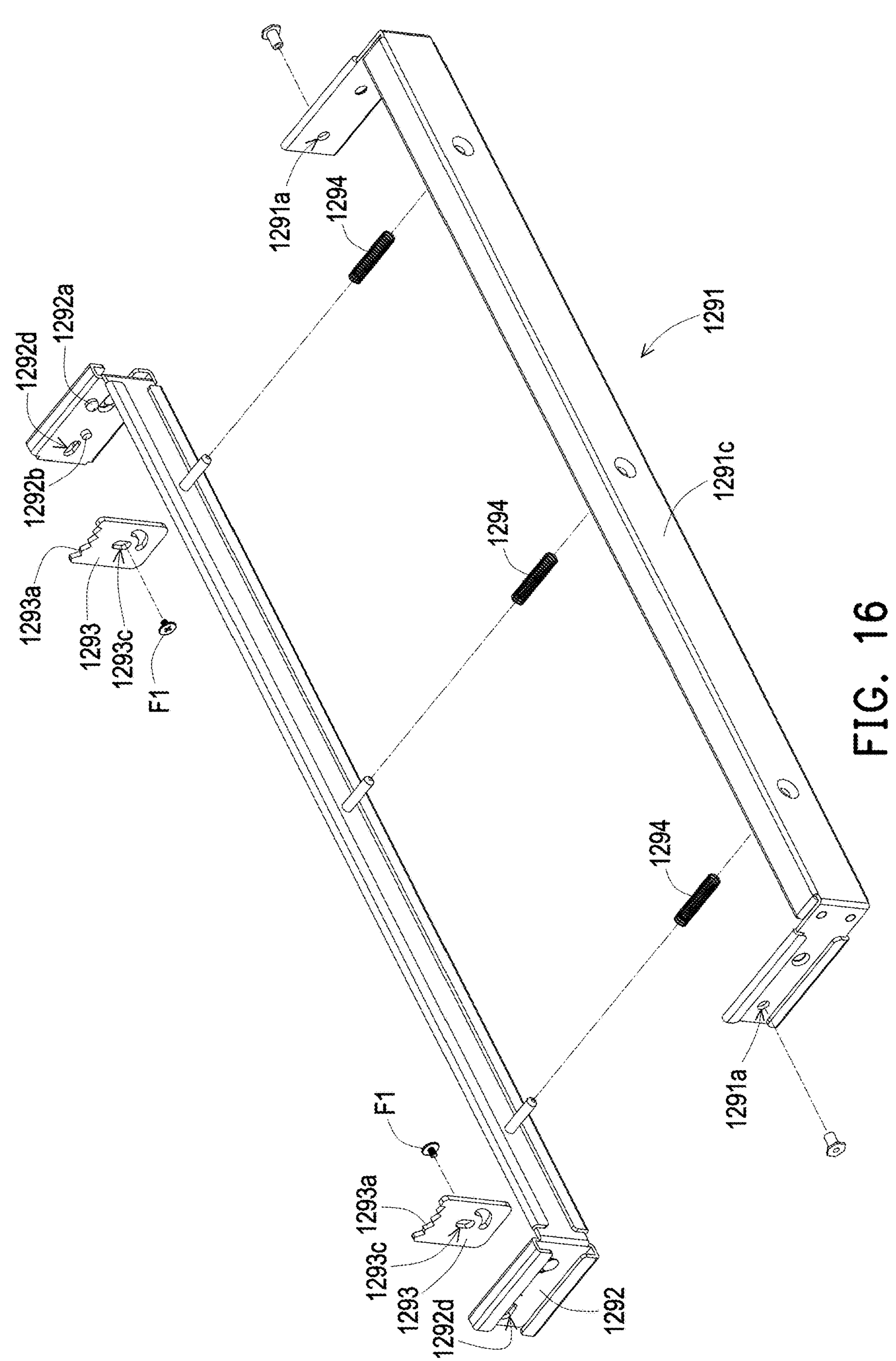
FIG. 16 is an exploded view of a handle component of FIG. 4.
Figure 17A:
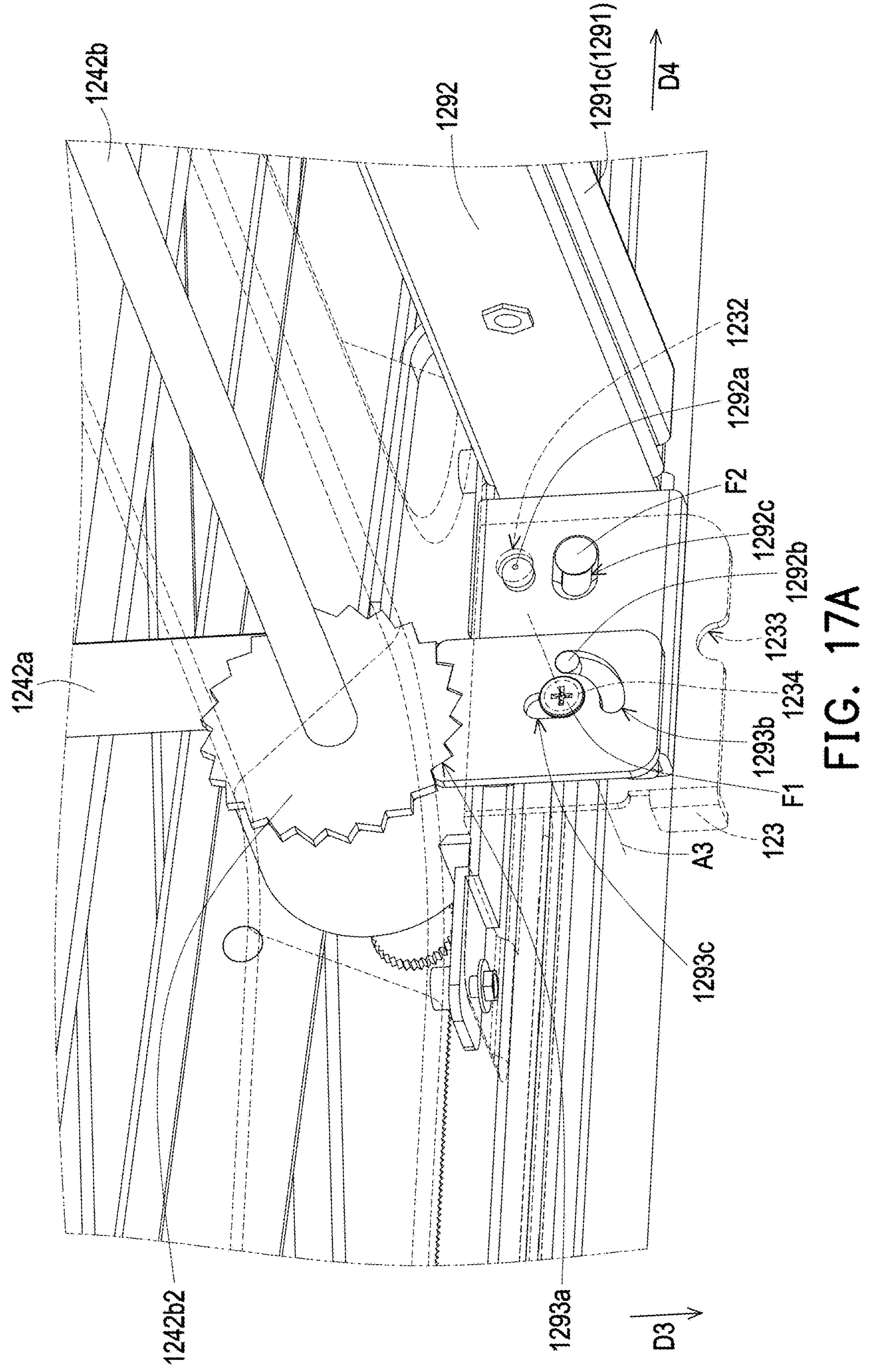
FIG. 17A to FIG. 17C illustrate an operation process of the handle component.
Figure 17B:
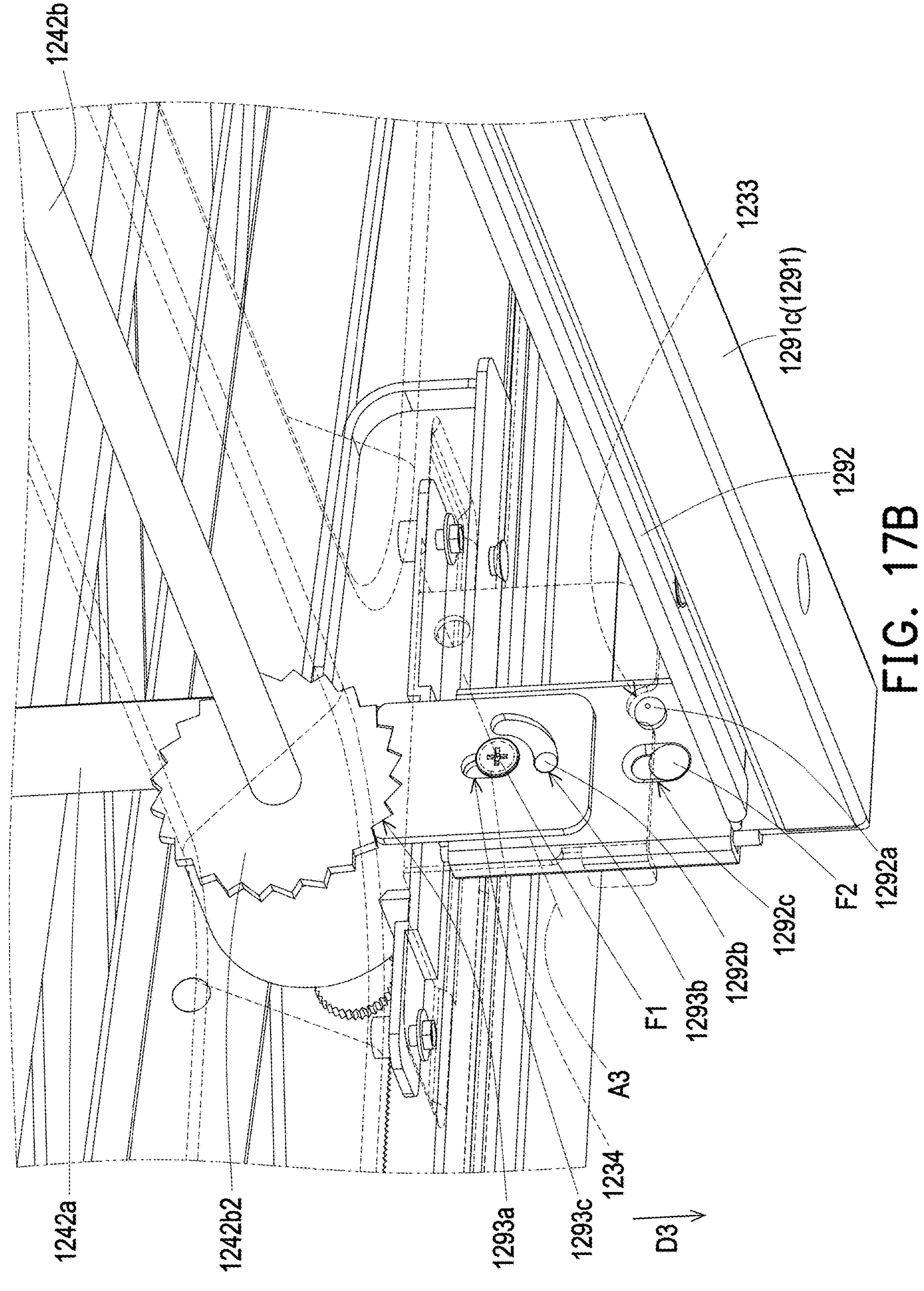
Figure 17C:
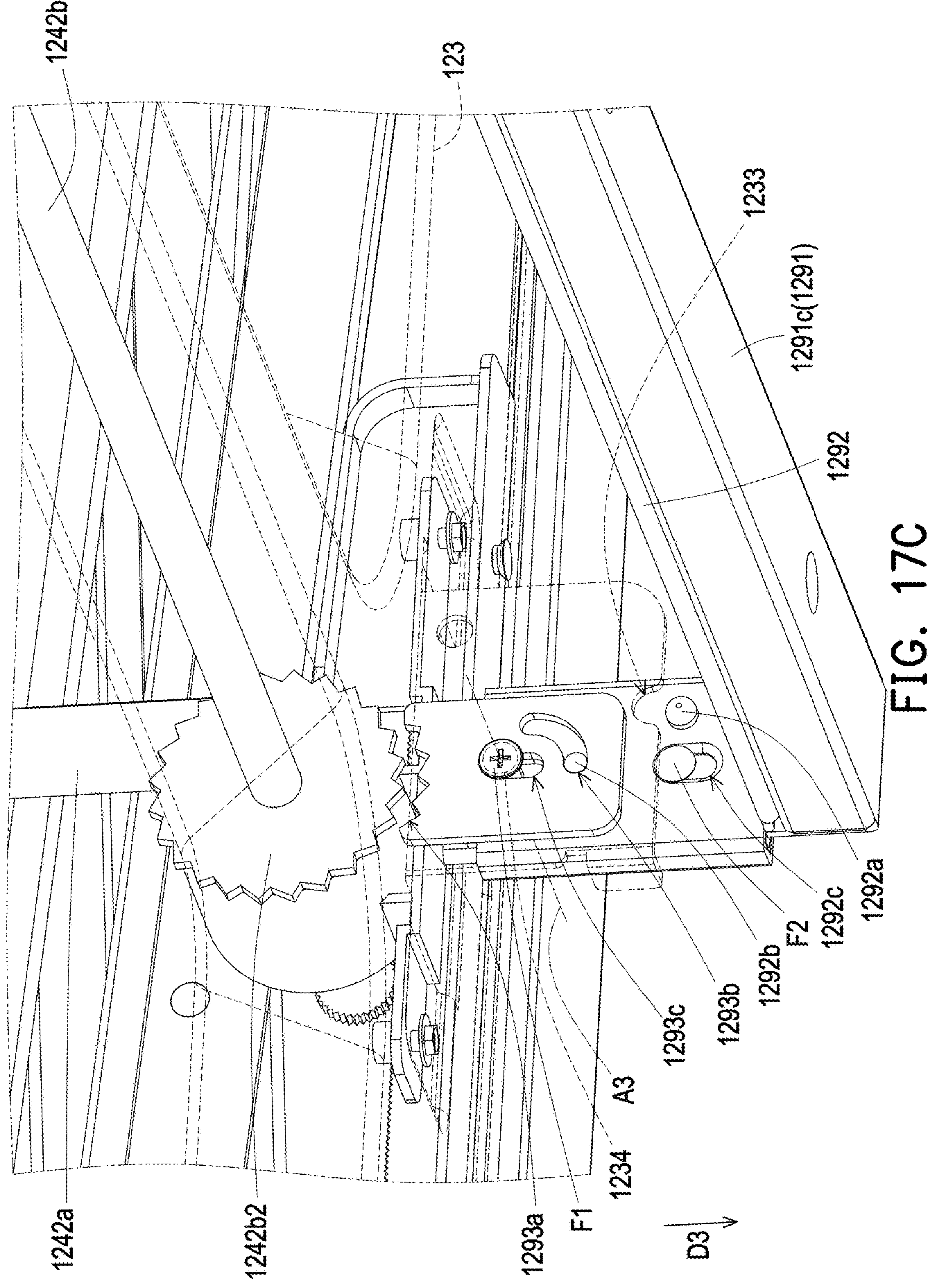

FIG. 16 is an exploded view of a handle component of FIG. 4. FIG. 17A to FIG. 17C illustrate an operation process of the handle component. In order to clearly illustrate a handle component 129 and the adjusting mechanism 124, the tray 123 in FIG. 17A to FIG. 17C is shown in a perspective manner. With reference to FIG. 4, FIG. 16, and FIG. 7, the suspension rack 120 further includes a handle component 129. To be specific, the handle component 129 includes a handle body 1291, a linkage member 1292, two stopping members 1293, and three elastic members 1294. The handle body 1291 is rotatably connected to the tray 123, the stopping members 1293 are slidably disposed on the handle body 1291, and the handle body 1291 may be detachably engaged with the rotating shaft 1242*b* through the stopping members 1293. The linkage member 1292 is connected to the handle body 1291, rotatably connected to the stopping members 1293, and used to slide relative to the handle body 1291 to drive the stopping members 1293 to separate from the rotating shaft 1242*b*. The elastic members 1294 are disposed between the handle body 1291 and the linkage member 1292.

With reference to FIG. 16 and FIG. 17A, to be specific, the handle component 129 is connected to a connecting hole 1234 (shown in FIG. 17A) of the tray 123 by a connecting member F1 passing through a connecting hole 1291*a* (shown in FIG. 16) of the handle body 1291, a sliding groove 1292*d* (shown in FIG. 16) of the linkage member 1292, and sliding grooves 1293*c* of the stopping members 1293, so that the handle component 129 may rotate relative to the tray 123. A connecting member F2 passes through the connecting hole 1291*a* of the handle body 1291 and is connected to the sliding groove 1292*c* of the linkage member 1292, so that the linkage member 1292 may slide relative to the handle body 1291. The rotating shaft 1242*b* is provided with a ratchet structure 1424*b*2, and each stopping member 1293 is provided with a meshing portion 1293*a* used to be meshed with the ratchet structure 1242*b*2. The linkage member 1292 is provided with a protrusion 1292*a*, and the tray 123 is provided with a slot 1232. When the handle component 129 is in a folded state, the handle component 1292 is engaged with the slot 1232 of the tray 123, and an operating portion 1291*c* of the handle body 1291 is adjacent to the tray 123.

An operation of the handle component 129 is described in detail in the following paragraphs.

With reference to FIG. 17A to FIG. 17C, first, when the user applies a force to unfold the handle component 129 relative to the tray 123, the protrusion 1292*a* of the linkage member 1292 is detached from the slot 1232 of the tray 123. Further, a sliding block 1292*b* of the linkage member 1292 slides along a sliding groove 1293*b* of the stopping member 1293, so that the handle body 1291 and the linkage member 1292 rotate to the position shown in FIG. 17B around a rotation axis A3 of the connecting member F1, and the protrusion 1292*a* extends into another slot 1233 of the tray 123. At this time, the handle component 129 is in an unfolded state, and the operating portion 1291*c* of the handle body 1291 is away from the tray 123.

Next, at this time, the sliding groove 1292*d* of the linkage member 1292 and the sliding groove 1293*c* of the stopping member 1293 are aligned and the extending direction is a direction D3. Accordingly, the user may apply a force to the linkage member 1292 in the direction D3, so that the linkage member 1292 slides relative to the handle body 1291 and drives the stopping member 1293 to move in the direction D3, thereby causing the meshing portion 1293*a* of the stopping member 1293 to separate from the ratchet structure 1242*b*2 of the rotating shaft 1242*b* as shown in FIG. 17C. In addition, as shown in FIG. 17, when the linkage member 1292 and the stopping member 1293 slide in the direction D3, the connecting members F1 and F2 slide relative to the sliding groove 1293*c* of the stopping member 1293 and the sliding groove 1292*c* of the linkage member 1292, respectively.

When the handle body 1291 and the linkage member 1292 are located at the position shown in FIG. 17C, the meshing portion 1293*a* is separated from the ratchet structure 1242*b*2, so that the rotating shaft 1242*b* may rotate along with the movement of the adjusting mechanism 124. Accordingly, the user may lower or lift up the tray 123 by pulling or pushing the handle component 129. On the contrary, when the handle body 1291 and the linkage member 1292 are located at the position shown in FIG. 17B, the meshing portion 1293*a* is meshed with the ratchet structure 1242*b*2, so that the rotating shaft 1242*b* cannot rotate, thereby making the coil spring 1242*a* unable to extend and retract and fixing the adjusting mechanism 124 at a specific height. That is, the user may adjust the height of the tray 123 by applying a force to the handle component 129, and the user may fix the height of the tray 123 by removing the applied force. This operating mechanism allows the user to suspend the tray 123 at different heights according to needs. On the other hand, if the user accidentally lets go of his/her hand during operation, the tray 123 automatically stops at the current height, allowing the user to operate safely.

In addition, when the handle body 1291 and the linkage member 1292 are located at the position shown in FIG. 17A, an extending direction D4 of the sliding groove 1292*d* of the linkage member 1292 is perpendicular to the extending direction of the sliding groove 1293*c* of the stopping member 1293. This design can prevent the user from accidentally separating the stopping member 1293 from the rotating shaft 1242*b* when the handle component 129 is folded, thereby causing the tray 123 to become unstable.

With reference to FIG. 13 and FIG. 14, the suspension rack 120 further includes a rack member 128. The rack member 128 is slidably disposed on the tray 123 and abuts against the connecting bar assembly 1241. The rotating shaft 1242*b* is provided with a gear portion 1242*b*1 meshed with the rack member 128, and the rack member 128 is driven to slide along the tray 123 as the rotating shaft 1242*b* rotates. When the meshing portion 1293*a* of the stopping member 1293 is meshed with the ratchet structure 1242*b*2 of the rotating shaft 1242*b*, the rotating shaft 1242*b* cannot rotate, and the rack member 128 cannot slide relative to the tray 123. Accordingly, the rack member 128 abutting against the connecting bar assembly 1241 may further prevent the connecting bar assembly 1241 from extending and retracting, thereby achieving a double self-locking and blocking effect.

Figure 18:
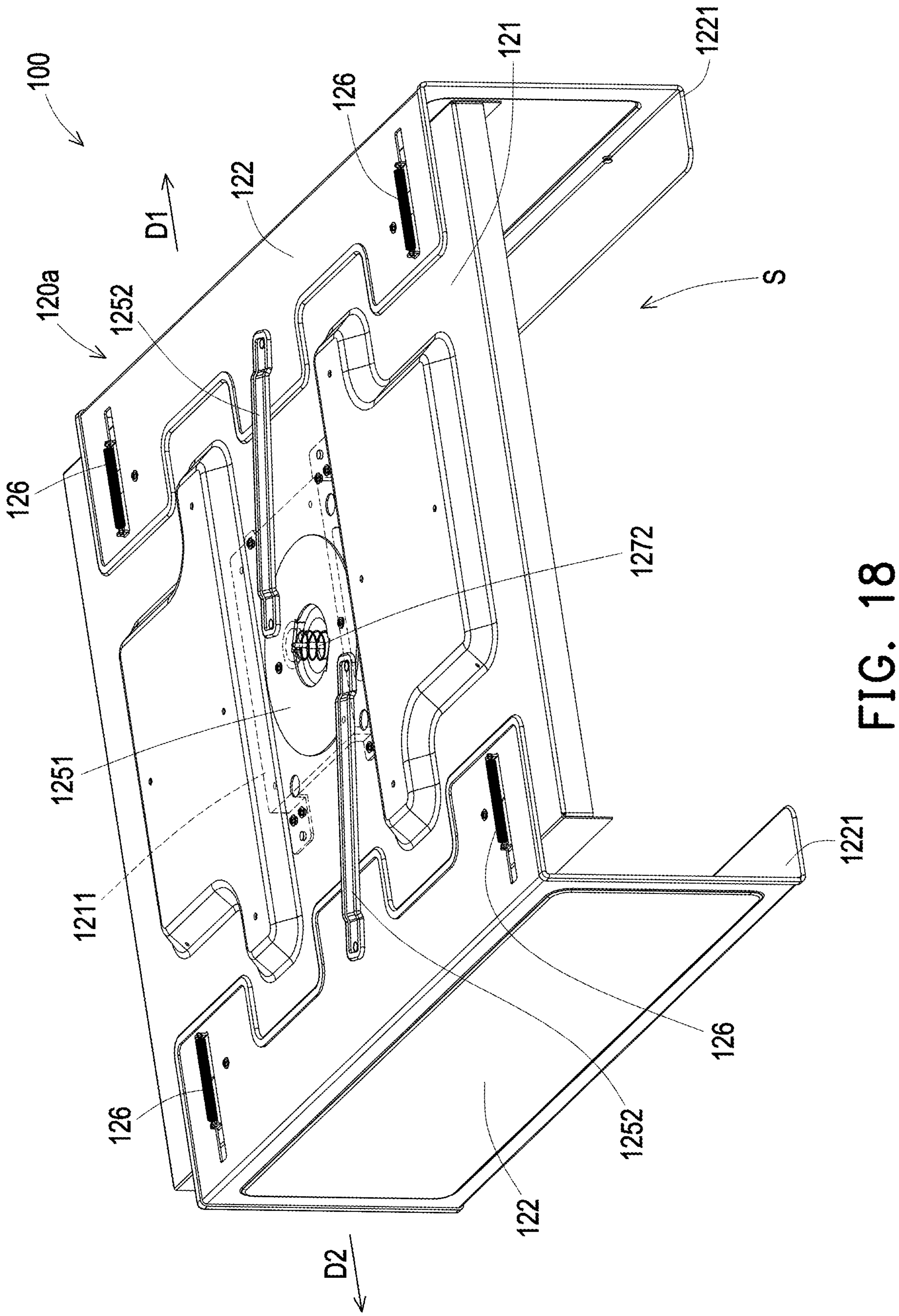
FIG. 18 is a schematic view of the electronic device according to yet another embodiment of the disclosure.

FIG. 18 is a schematic view of the electronic device according to yet another embodiment of the disclosure. The difference between a suspension rack 120*a* of this embodiment and the suspension rack 120 shown in FIG. 2 is that the suspension rack 120*a* of this embodiment does not include the tray 123 and the adjusting mechanism 124 of the suspension rack 120 shown in FIG. 2. That is, when the user takes the object 110 out of the accommodating space S, the user directly applies a force to the object 110 to move the object 110 from the accommodating space S to another platform. When the user places the object 110 into the accommodating space S and the object 110 is carried by the bracket 122, the user directly applies a force to the object 110 to lift the object 110 into the accommodating space S and pushes the object 110 against the rotating member 1251 as described above, so that the bracket 122 slides relative to the supporting member 121 to the carrying portion. Finally, the user removes the force applied to the object 110, so that the carrying portion 1221 directly carries the object 110 in the accommodating space S.

In view of the foregoing, in the electronic device and the suspension rack provided by the disclosure, when the rotating member of the linkage mechanism rotates relative to the supporting member, the connecting bar pivotally connected to the rotating member is synchronously driven and further drives the bracket pivotally connected to the other end of the connecting bar, so that the bracket slides relative to the supporting member. The user may carry the object in the accommodating space or take the object out of the accommodating space according to the position of the bracket relative to the supporting member. In an embodiment, the suspension rack may further include the adjusting mechanism to drive the tray to be lifted and lowered. In such an operating mechanism, the space occupied by the suspension rack may be reduced, and the user may operate the suspension rack conveniently.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A suspension rack, comprising:
- a supporting member;
- a bracket slidably disposed on the supporting member; and
- a linkage mechanism comprising a rotating member and a linking bar, wherein the rotating member is rotatably disposed on the supporting member, and one end of the linking bar is pivotally connected to the rotating member, and the other end of the linking bar is pivotally connected to the bracket,
- wherein the bracket is driven to slide relative to the supporting member through the linking bar by the rotating member.

2. The suspension rack according to claim 1, further comprising an elastic member connected between the bracket and the supporting member, wherein the bracket is used to resist an elastic force of the elastic member, and the bracket is driven to slide relative to the supporting member by the elastic force of the elastic member.

3. The suspension rack according to claim 1, further comprising a push-push mechanism connected to the rotating member, and the rotating member is driven rotate by the push-push mechanism.

4. The suspension rack according to claim 3, wherein the push-push mechanism comprises a movable member, an elastic member, and a column, the movable member is provided with a guiding groove, the elastic member is connected between the movable member and the supporting member, the column is connected to the rotating member and extends into the guiding groove, the movable member is used to be subjected to a force to resist an elastic force of the elastic member, the movable member is moved upwardly through the elastic force of the elastic member, and the column is moved along the guiding groove as the movable member is driven to rotate by the rotating member.

5. The suspension rack according to claim 4, wherein the guiding groove comprises at least one inclined section, and the column is moved along the at least one inclined section as the movable member driven to rotate by the rotating member.

6. The suspension rack according to claim 4, wherein the guiding groove is provided with a step difference portion, and a moving direction of the column in the guiding groove is limited by the step difference portion.

7. The suspension rack according to claim 1, wherein the bracket comprises two brackets, the linking bar comprises two linking bars, the two brackets are disposed at two opposite ends of the supporting member by the two linking bars, and the two brackets are driven to move away from or be close to each other relative to the supporting member through the two linking bars.

8. The suspension rack according to claim 1, further comprising a tray and an adjusting mechanism, wherein the tray is connected to the supporting member through the adjusting mechanism, and the tray is driven to be close to or move away from the supporting member by the adjusting mechanism.

9. The suspension rack according to claim 8, wherein the adjusting mechanism comprises a connecting bar assembly and an elastic component, the connecting bar assembly is connected between the supporting member and the tray and the tray is driven to lift and lower relative to the supporting member by the connecting bar assembly, and the elastic component is connected between the tray and the supporting member and is used to provide an elastic force to assist the tray to be lifted.

10. The suspension rack according to claim 9, wherein the elastic component comprises a coil spring and a rotating shaft rotatably disposed on the tray, and the coil spring is connected between the rotating shaft and the supporting member and is at least partially wound around the rotating shaft.

11. The suspension rack according to claim 10, further comprising a rack member slidably disposed on the tray and abutting against the connecting bar assembly, wherein the rotating shaft is provided with a gear portion meshed with the rack member, and the rack member is driven to slide along the tray as the rotating shaft rotates.

12. The suspension rack according to claim 10, further comprising a handle component comprising a handle body and a stopping member, wherein the handle body is rotatably connected to the tray, the stopping member is slidably disposed on the handle body, and the handle body is detachably engaged with the rotating shaft through the stopping member.

13. The suspension rack according to claim 12, wherein the handle component comprises a linkage member connected to the handle body and rotatably connected to the stopping member.

14. The suspension rack according to claim 13, wherein the rotating shaft is provided with a ratchet structure, and the stopping member is provided with a meshing portion used to be meshed with the ratchet structure.

15. An electronic device, comprising:
- an object; and
- a suspension rack, comprising:
  - a supporting member;
  - a bracket slidably disposed on the supporting member and provided with a carrying portion, wherein an accommodating space is formed between the carrying portion and the supporting member, and the object is carried by the carrying portion in the accommodating space; and
  - a linkage mechanism comprising a rotating member and a connecting bar, wherein the rotating member is rotatably disposed on the supporting member, one end of the linking bar is pivotally connected to the rotating member, the other end of the linking bar is pivotally connected to the bracket, and the bracket is driven to slide relative to the supporting member through the linking bar by the rotating member.

16. The electronic device according to claim 15, wherein the bracket comprises two brackets, the linking bar comprises two linking bars, the two brackets are disposed at two opposite ends of the supporting member by the two linking bars, and the two brackets are driven to be close to or move away from each other relative to the supporting member through the two linking bars.

17. The electronic device according to claim 16, wherein when the two brackets are close to each other to a carrying position, the carrying portion is used to carry the object, and when the two brackets move away from each other to a release position, the object is used to leave or enter the accommodating space.

18. A suspension rack, comprising:

a supporting member;

a bracket slidably disposed on the supporting member and provided with a carrying portion;

a tray used to be carried by the carrying portion of the bracket;

an adjusting mechanism connected between the supporting member and the tray and driving the tray to be lifted and lowered; and a linkage mechanism comprising a rotating member and a linking bar, wherein the rotating member is rotatably disposed on the supporting member, one end of the linking bar is pivotally connected to the rotating member, the other end of the linking bar is pivotally connected to the bracket, and the bracket is driven to slide relative to the supporting member through the linking bar by the rotating member.

19. The suspension rack according to claim 18, further comprising a handle component comprising a handle body and a stopping member, wherein the handle body is rotatably connected to the tray, the stopping member is slidably disposed on the handle body, and the handle body is detachably engaged with the adjusting mechanism through the stopping member.

20. The suspension rack according to claim 19, wherein when the handle component is in a folded state, an operating portion of the handle body is adjacent to the tray, and when the handle component is in an unfolded state, the operating portion of the handle body is away from the tray.

* * * * *